US012580235B2

(12) United States Patent
Shigemori et al.

(10) Patent No.: US 12,580,235 B2
(45) Date of Patent: Mar. 17, 2026

(54) SYSTEM AND METHOD FOR BATTERY MANAGEMENT WITH MULTIPLE BATTERY MONITORING DEVICES

(71) Applicant: DENSO CORPORATION, Kariya-city (JP)

(72) Inventors: Shogo Shigemori, Kariya-city (JP); Tatsuhiro Numata, Kariya-city (JP); Tetsuya Watanabe, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 720 days.

(21) Appl. No.: 17/896,239

(22) Filed: Aug. 26, 2022

(65) Prior Publication Data

US 2023/0069478 A1 Mar. 2, 2023

(30) Foreign Application Priority Data

Aug. 30, 2021 (JP) ................................. 2021-139725

(51) Int. Cl.
  *H01M 10/42* (2006.01)
  *G01R 31/382* (2019.01)
(52) U.S. Cl.
  CPC ...... *H01M 10/4257* (2013.01); *G01R 31/382* (2019.01); *H01M 2010/4271* (2013.01); *H01M 2010/4278* (2013.01); *H01M 2220/20* (2013.01)
(58) Field of Classification Search
  CPC ........... H01M 10/4257; H01M 10/425; H01M 10/482; H01M 10/48; H01M 2010/4271;
  (Continued)

(56) References Cited

U.S. PATENT DOCUMENTS 8,399,115 B2 3/2013 Ellwanger
2014/0312913 A1 10/2014 Kikuchi et al.
(Continued)

FOREIGN PATENT DOCUMENTS

JP 2012-222913 A 11/2012

OTHER PUBLICATIONS

U.S. Appl. No. 17/896,200, filed Aug. 26, 2022, Shigemori et al.
(Continued)

*Primary Examiner* — Raymond Alejandro
(74) *Attorney, Agent, or Firm* — Posz Law Group, PLC

(57) ABSTRACT

A battery management system includes more than three monitoring devices arranged inside a housing with a battery. The monitoring devices monitor the battery and acquire battery monitoring information. The monitoring devices and a controller that controls the battery voltage perform wireless communication via a communication path from the controller through each of the monitoring devices to the controller. The controller transmits a request signal to a receiving device that is one of the monitoring devices, and receives the battery monitoring information of all the monitoring devices from a transmitting device that is another of the monitoring devices. Another monitoring device is a far device farther in distance from the controller than the receiving device and the transmitting device are. The far device receives the request signal through the receiving device, and transmits the battery monitoring information to the controller through the transmitting device in response to the request signal.

17 Claims, 12 Drawing Sheets

(58) Field of Classification Search

CPC ...... H01M 2010/4278; H01M 2220/20; G01R 31/382

See application file for complete search history.

(56) References Cited

U.S. PATENT DOCUMENTS

| | | | |
|---|---|---|---|
| 2016/0056510 A1* | 2/2016 | Takeuchi ............ | H01M 10/425 |
| | | | 429/50 |
| 2019/0305386 A1* | 10/2019 | Lee ..................... | G01R 31/392 |
| 2020/0028218 A1 | 1/2020 | Yamazoe et al. | |
| 2020/0106278 A1* | 4/2020 | Sung ................... | H02J 7/0047 |
| 2020/0350935 A1* | 11/2020 | Hou ..................... | H04B 1/0025 |
| 2021/0068033 A1* | 3/2021 | Seon ................... | H04W 28/04 |
| 2021/0242508 A1* | 8/2021 | Millen ................ | H04L 63/123 |

OTHER PUBLICATIONS

U.S. Appl. No. 17/896,217, filed Aug. 26, 2022, Shigemori et al.
U.S. Appl. No. 17/896,198, filed Aug. 26, 2022, Shigemori et al.
U.S. Appl. No. 17/896,417, filed Aug. 26, 2022, Ohata et al.
U.S. Appl. No. 17/896,261, filed Aug. 26, 2022, Nakagawa et al.
U.S. Appl. No. 17/896,179, filed Aug. 26, 2022, Ohata et al.
U.S. Appl. No. 17/896,186, filed Aug. 26, 2022, Moriya et al.
U.S. Appl. No. 17/896,203, filed Aug. 26, 2022, Nakata et al.

* cited by examiner

FIG. 6

SYSTEM AND METHOD FOR BATTERY MANAGEMENT WITH MULTIPLE BATTERY MONITORING DEVICES

CROSS REFERENCE TO RELATED APPLICATION

The present application is based on and incorporates herein by reference Japanese Patent Application No. 2021-139725 filed on Aug. 30, 2021.

TECHNICAL FIELD

The present disclosure relates to a system and method for battery management.

BACKGROUND

A battery management system uses wireless communication.

SUMMARY

According to an aspect of the present disclosure, a battery management system includes more than three monitoring devices and a controller. The monitoring devices are arranged inside a housing together with a battery. The monitoring devices monitor the battery and acquire battery monitoring information that includes information indicating a state of the battery. The controller performs wireless communication with two of the monitoring devices and executes a predetermined process based on the battery monitoring information of each of the monitoring devices. The monitoring devices and the controller perform wireless communication via a communication path from the controller through each of the monitoring devices to the controller. The controller transmits a request signal to a receiving device that is one of the monitoring devices, and the request signal is a signal requesting for transmission of the battery monitoring information. The controller receives the battery monitoring information of all the monitoring devices from a transmitting device that is one of the monitoring devices different from the receiving device. One of the monitoring devices different from the receiving device and the transmitting device is a far device farther from the controller than the receiving device and the transmitting device are. The far device receives the request signal through the receiving device, and transmits the battery monitoring information to the controller through the transmitting device in response to the received request signal.

BRIEF DESCRIPTION OF THE DRAWINGS

The details of one or more embodiments are set forth in the accompanying drawings and the description below. Other features and advantages will be apparent from the description and drawings, and from the claims.

FIG. 6 is a diagram illustrating a communication sequence between a monitoring device and a controller, according to the first embodiment.

DETAILED DESCRIPTION

Figure 1:
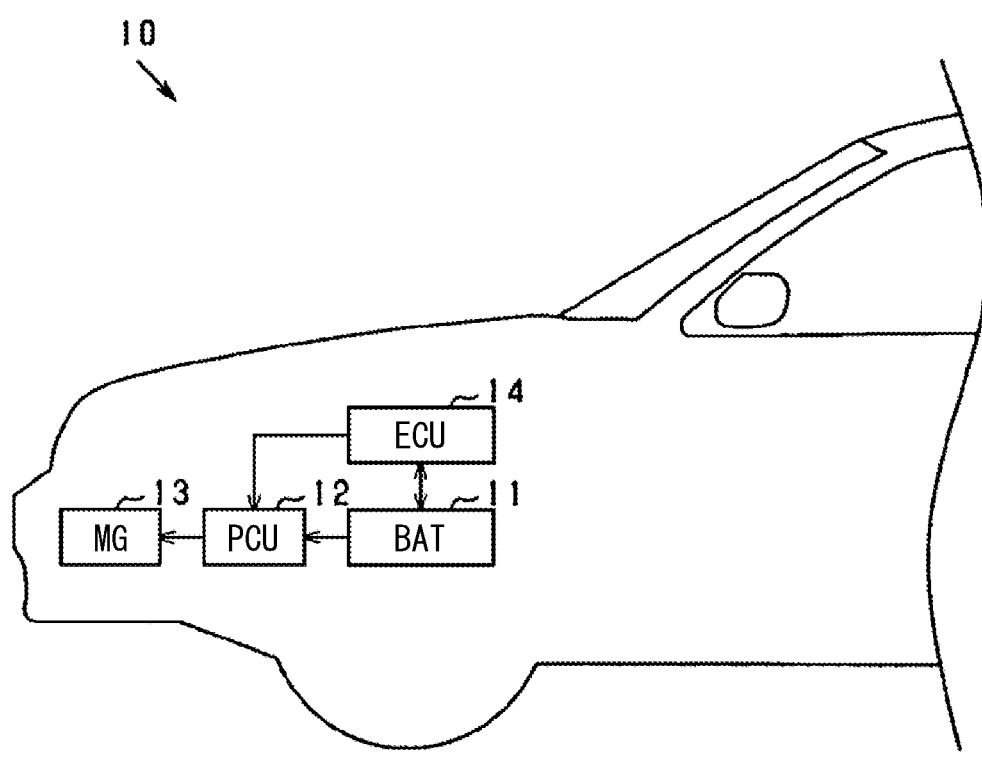
FIG. 1 is a diagram illustrating a vehicle including a battery pack.

To begin with, examples of relevant techniques will be described. A battery management system according to a comparative example uses wireless communication. The disclosure of the prior art literature (U.S. Pat. No. 8,399,115 B2) is incorporated herein by reference to explain technical elements presented herein.

In the battery management system using wireless communication, a controller and monitoring devices that monitors a state of a battery are connected in series and perform wireless communication. The controller acquires battery monitoring information from one monitoring device by the wireless communication and executes a predetermined process. one of the monitoring devices located farthest from the controller among the monitoring devices is more likely to fail to transmit battery monitoring information to the controller than the other monitoring devices.

In contrast, according to the present disclosure, a system and method for battery management is capable of reducing a frequency of failure in transmission of battery monitoring information.

According to an aspect of the present disclosure, a battery management system includes more than three monitoring devices and a controller. The monitoring devices are arranged inside a housing together with a battery. The monitoring devices monitor the battery and acquire battery monitoring information that includes information indicating a state of the battery. The controller performs wireless communication with two of the monitoring devices and executes a predetermined process based on the battery monitoring information of each of the monitoring devices. The monitoring devices and the controller perform wireless communication via a communication path from the controller through each of the monitoring devices to the controller. The controller transmits a request signal to a receiving device that is one of the monitoring devices, and the request signal is a signal requesting for transmission of the battery monitoring information. The controller receives the battery monitoring information of all the monitoring devices from a transmitting device that is one of the monitoring devices different from the receiving device. One of the monitoring devices different from the receiving device and the transmitting device is a far device farther from the controller than the receiving device and the transmitting device are. The far device receives the request signal through the receiving device, and transmits the battery monitoring information to the controller through the transmitting device in response to the received request signal.

According to the disclosed battery management system, the far device receives the request signal via the receiving device and transmits the battery monitoring information in response to the received request signal to the controller via the transmitting device. As a result, a frequency of failure in transmission of the battery monitoring information from the far device to the controller can be reduced.

According to another aspect of the present disclosure, a method for managing a battery is disclosed. The battery is arranged inside a housing together with more than three monitoring devices. The monitoring devices monitor the battery and acquire battery monitoring information that includes information indicating a state of the battery. A controller performs wireless communication with two of the monitoring devices and execute a predetermined process based on the battery monitoring information of each of the monitoring devices. The monitoring devices and the controller perform wireless communication via a communication path from the controller through each of monitoring devices to the controller. In the method, a request signal is transmitted from the controller to a receiving device that is one of the monitoring devices. The request signal is a signal requesting for transmission of the battery monitoring information. The battery monitoring information of all the monitoring devices is transmitted to the controller from a transmitting device that is one of the monitoring devices different from the receiving device. The request signal is transmitted from the receiving device to a far device that is one of the monitoring devices different from the receiving device and the transmitting device and is farther from the controller than the receiving device and the transmitting device are. The battery monitoring information is transmitted from the far device to the transmitting device in response to the received request signal.

According to the disclosed battery management method, the far device receives the request signal via the receiving device and transmits the battery monitoring information in response to the received request signal to the controller via the transmitting device. As a result, a frequency of failure in transmission of the battery monitoring information from the far device to the controller can be reduced.

Hereinafter, multiple embodiments will be described with reference to the drawings. The same or corresponding elements in the embodiments are assigned the same reference numerals, and descriptions thereof will not be repeated. When only a part of the configuration is described in one embodiment, the other parts of the configuration may employ descriptions about a corresponding configuration in another embodiment preceding the one embodiment. Further, not only the combinations of the configurations explicitly shown in the description of the respective embodiments, but also the configurations of multiple embodiments can be partially combined even when they are not explicitly shown as long as there is no difficulty in the combination in particular.

First Embodiment

First, a configuration of a vehicle on which a battery management system according to the present embodiment is mounted will be described with reference to FIG. 1. Particularly, a vehicle related to a battery pack including the battery management system will be described. FIG. 1 is a diagram illustrating a schematic configuration of the vehicle.

The vehicle is an electric vehicle such as a battery electric vehicle (BEV), a hybrid electric vehicle (HEV), or a plug-in hybrid electric vehicle (PHEV). The battery management system can also be applied to a mobile body other than vehicles, and, for example, can be applied to a flying body like a drone, a ship, a construction machine, or an agricultural machine. The battery management system can also be applied to stationary batteries (storage batteries) for home use, business use, and the like.

<Vehicle>

As shown in FIG. 1, a vehicle 10 includes a battery pack (BAT) 11, a PCU 12, an MG 13, and an ECU 14. "PCU" is an abbreviation for "Power Control Unit". "MG" is an abbreviation of "Motor Generator". "ECU" is an abbreviation of "Electronic Control Unit".

The battery pack 11 includes an assembled battery 20 described later, and provides a chargeable and dischargeable DC voltage source. The battery pack 11 supplies electric power to an electric load of the vehicle 10. For example, the battery pack 11 supplies the electric power to the MG 13 through the PCU 12. The battery pack 11 is charged through the PCU 12. The battery pack 11 may be referred to as a main machine battery.

For example, as illustrated in FIG. 1, the battery pack 11 is disposed in a front compartment of the vehicle 10. The battery pack 11 may be disposed in a rear compartment, under a seat, under a floor, or the like. For example, in the case of a hybrid electric vehicle, a compartment in which an engine is disposed may be referred to as an engine compartment or an engine room.

A temperature of the battery pack 11 is adjusted by air flowing into the vehicle 10 running and cooling air supplied from a fan mounted on the vehicle 10. The temperature of the battery pack 11 may be adjusted by a cooling liquid circulating inside the vehicle 10. The temperature adjustment described above reduces an excessive temperature change of the battery pack 11. The battery pack 11 may be simply coupled to a member having a large heat capacity, such as a body of the vehicle 10, in a thermally conductive manner.

The PCU 12 executes bidirectional power conversion between the battery pack 11 and the MG 13 according to a control signal from the ECU 14. The PCU 12 may be referred to as a power converter. The PCU 12 can include an inverter and a converter. The converter is disposed in an energization path between the battery pack 11 and the inverter. The converter has a function of raising and lowering the DC voltage. The inverter converts the DC voltage raised by the converter into an AC voltage such as a three-phase AC voltage, and outputs the AC voltage to the MG 13. The inverter converts the generated power of the MG 13 into a DC voltage and outputs the DC voltage to the converter.

The MG 13 is an AC rotating machine such as a three-phase AC synchronous motor in which a permanent magnet is embedded in a rotor. The MG 13 functions as a drive source for running of the vehicle 10, that is, an electric motor. The MG 13 is driven by the PCU 12 to generate a rotational driving force. The driving force generated by the MG 13 is transmitted to a drive wheel. The MG 13 functions as a generator at the time of braking of the vehicle 10 and performs regenerative power generation. The generated power of the MG 13 is supplied to the battery pack 11 through the PCU 12 and stored in the assembled battery 20 inside the battery pack 11.

The ECU 14 includes a computer including a processor, a memory, an input/output interface, and a bus that connects these components. The processor is hardware for arithmetic processing. The processor includes, for example, a CPU as a core. "CPU" is an abbreviation for "Central Processing Unit". The memory is a non-transitory tangible storage medium that non-transiently stores computer-readable programs, data, and the like. The memory stores various programs to be executed by the processor.

The ECU 14 acquires information regarding the assembled battery 20 from the battery pack 11, for example, and controls the PCU 12 to control driving of the MG 13 and charging and discharging of the battery pack 11. The ECU 14 may acquire information such as a voltage, a temperature, a current, an SOC, and an SOH of the assembled battery 20 from the battery pack 11. The ECU 14 may acquire battery information such as a voltage, a temperature, and a current of the assembled battery 20 and calculate an SOC and an SOH. "SOC" is an abbreviation for "State Of Charge". "SOH" is an abbreviation for "State Of Health".

The processor of the ECU 14 executes, for example, multiple instructions included in a PCU control program stored in the memory. As a result, the ECU 14 constructs multiple functional units for controlling the PCU 12. As described above, in the ECU 14, the program stored in the memory causes the processor to execute the multiple instructions, thereby constructing the functional units. The ECU 14 may be referred to as an EVECU.

<Battery Pack>

Figure 2:
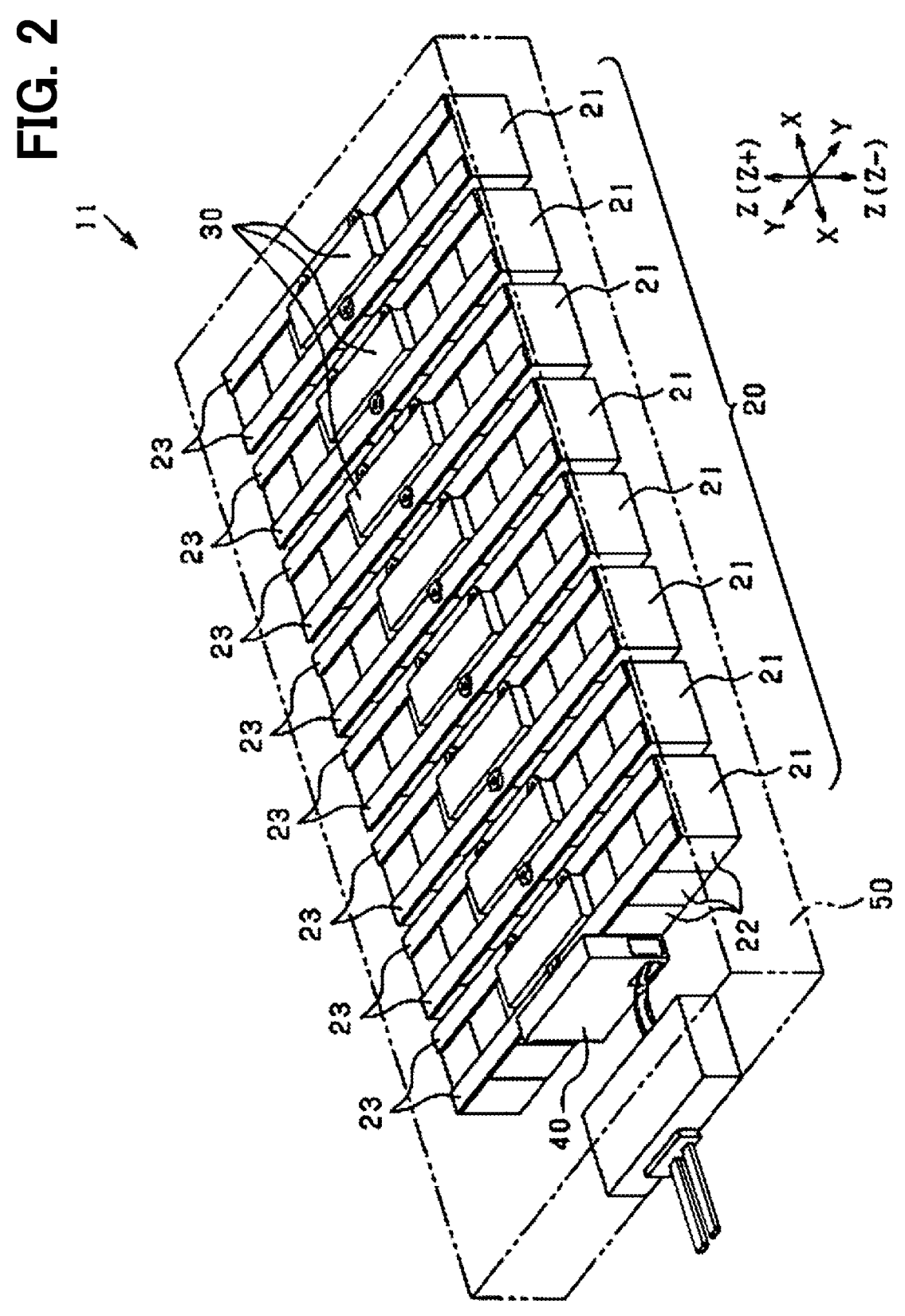
FIG. 2 is a perspective view illustrating a schematic configuration of the battery pack.
Figure 3:
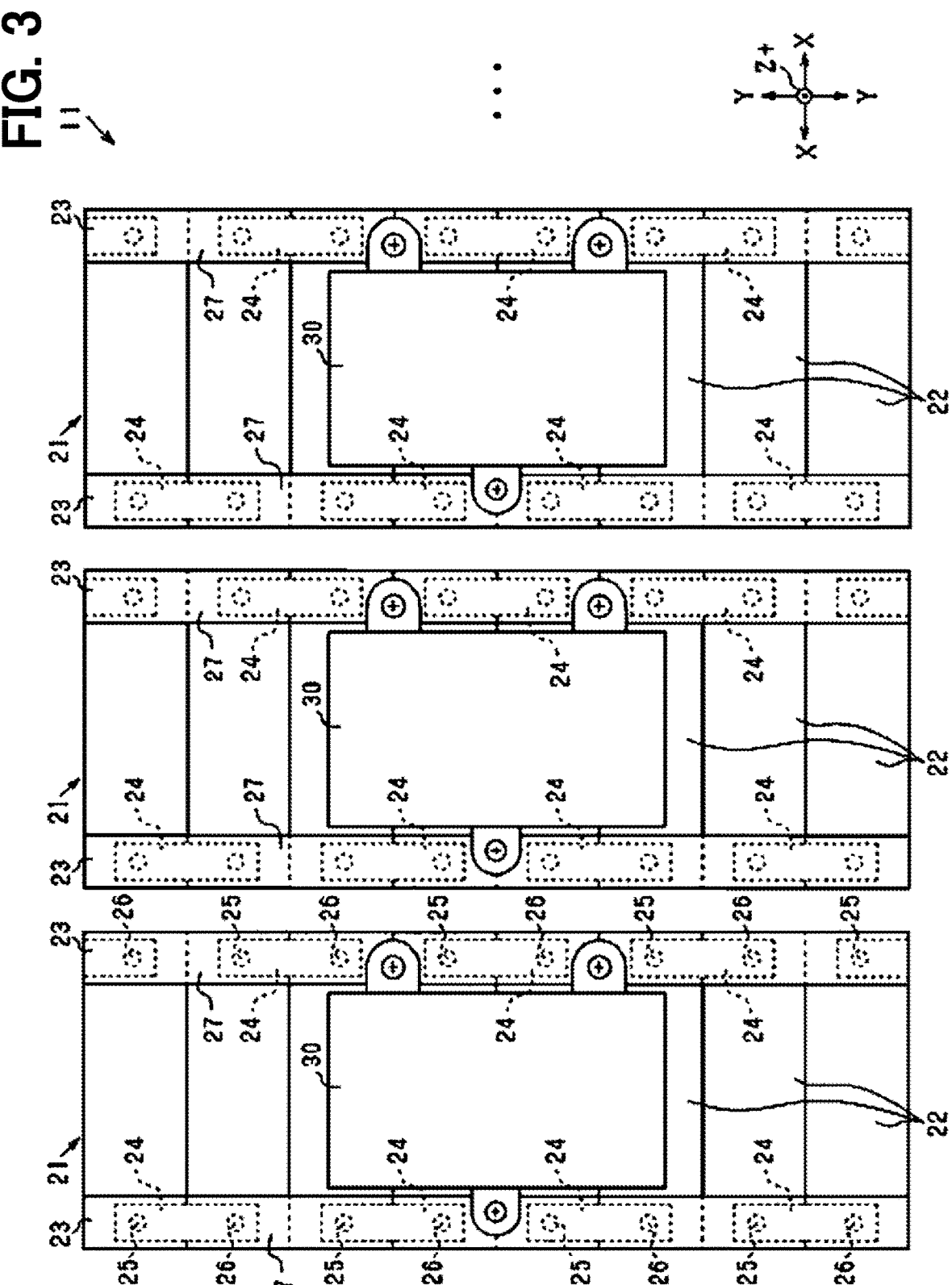
FIG. 3 is a top view illustrating an assembled battery.

Next, an example of a configuration of the battery pack 11 will be described with reference to FIGS. 2 and 3. FIG. 2 is a perspective view schematically illustrating an inside of the battery pack 11. In FIG. 2, a housing 50 is indicated by a two-dot chain line. FIG. 3 is a top view illustrating an upper surface of each battery stack.

As illustrated in FIG. 2, the battery pack 11 includes the assembled battery 20, more than three monitoring devices 30, a controller 40, and the housing 50. Hereinafter, as illustrated in FIG. 2, a longitudinal direction is referred to as an X direction, and a lateral direction is referred to as a Y direction, on a mounting surface of the housing 50 attached to the vehicle 10 that is one of surfaces of the housing 50 having a substantially rectangular parallelepiped shape. In FIG. 2, a lower surface of the housing 50 is the mounting surface. An up-down direction perpendicular to the mounting surface is referred to as a Z direction. The X direction, the Y direction, and the Z direction are arranged to be orthogonal to each other. In the present embodiment, a right-left direction of the vehicle 10 corresponds to the X direction, a front-rear direction of the vehicle 10 corresponds to the Y direction, and the up-down direction of the vehicle 10 corresponds to the Z direction. The arrangement of FIGS. 2 and 3 is merely an example, and the battery pack 11 may be arranged in any manner relative to the vehicle 10.

The assembled battery 20 includes battery stacks 21 arranged side by side in the X direction. The battery stacks 21 may be referred to as battery blocks, battery modules, or the like. The assembled battery 20 is formed by the battery stacks 21 connected in series and/or in parallel. In the present embodiment, the battery stacks 21 are connected in series.

Each battery stack 21 has battery cells 22. The battery cells 22 are accommodated in a case. As a result, the relative positions of the battery cells 22 are fixed. The case is made of metal or resin. When the case is made of metal, an electrically insulating member may be partially or entirely interposed between a wall surface of the case and the battery cells 22.

The form of the fixing member is not particularly limited as long as the relative positions of the battery cells 22 can be fixed. For example, a configuration in which the battery cells 22 are restrained by a band having a strip shape can be adopted. In this case, a separator for keeping a separation distance between the battery cells 22 may be interposed between the battery cells 22.

Each battery stack 21 includes the battery cells 22 connected in series. In the battery stack 21 of the present embodiment, the battery cells 22 arranged side by side in the Y direction are connected in series. The assembled battery 20 provides the above-described DC voltage source. The assembled battery 20, the battery stacks 21, and the battery cells 22 correspond to a battery.

Each battery cell 22 is a secondary battery that generates an electromotive voltage by a chemical reaction. A lithium ion secondary battery, a nickel-metal hydride secondary battery, an organic radical battery, or the like can be adopted as the secondary battery. The lithium ion secondary battery is a secondary battery using lithium as a charge carrier. The secondary battery that can be adopted as the battery cell 22 may be not only a secondary battery in which the electrolyte is a liquid but also a so-called all-solid-state battery using a solid electrolyte.

The battery cell 22 includes a power generating element and a battery case that accommodates the power generating element. As illustrated in FIG. 3, the battery case of each battery cell 22 is formed in a flat shape. The battery case has two end surfaces facing in the Z direction, and having a total of four lateral surfaces including two lateral surfaces facing in the X direction and two lateral surfaces facing in the Y direction. The battery case of the present embodiment is made of metal.

The battery cells 22 are stacked such that lateral surfaces of the battery cases are in contact with each other in the Y direction. Each battery cell 22 has a positive electrode terminal 25 and a negative electrode terminal 26 at different ends in the X direction. The positive electrode terminal 25 and the negative electrode terminal 26 protrude in the Z direction, more specifically, a Z+ direction that is an upward direction. The positions of the end surfaces from which the positive electrode terminal 25 and the negative electrode terminal 26 protrude are the same in the Z direction for each battery cell 22. The battery cells 22 are stacked such that the positive electrode terminals 25 and the negative electrode terminals 26 are alternately arranged in the Y direction.

Linear bus bar units 23 are disposed at both ends of an upper surface of each battery stack 21 in the X direction. The bus bar units 23 are disposed on both ends, in the X direction, of the end surfaces of the battery cases from which the positive electrode terminal 25 and the negative electrode terminal 26 protrude. That is, a pair of bus bar units 23 are disposed in each battery stack 21.

Each bus bar unit 23 includes bus bars 24 electrically connecting the positive electrode terminals 25 and the negative electrode terminals 26 alternately arranged in the Y direction, and a bus bar cover 27 covering the bus bars 24. Each bus bar 24 is a plate material made of a metal having good conductivity such as copper or aluminum. The bus bar 24 electrically connects the positive electrode terminal 25 and the negative electrode terminal 26 of the battery cells 22 adjacent to each other in the Y direction. As a result, in each battery stack 21, the battery cells 22 are connected in series.

According to such a connection structure, in each battery stack 21, one of two battery cells 22 located at the opposite ends of the battery cells 22 arranged in the Y direction has the highest potential, and the other has the lowest potential.

A predetermined wire is connected to at least one of the positive electrode terminal 25 of the battery cell 22 having the highest potential and the negative electrode terminal 26 of the battery cell 22 having the lowest potential.

As illustrated in FIG. 2, the battery stacks 21 are arranged in the X direction. The positive electrode terminal 25 of the battery cell 22 having the highest potential in one of two battery stacks 21 adjacent to each other in the X direction is connected via a predetermined wire to the negative electrode terminal 26 of the battery cell 22 having the lowest potential in the other of the two battery stacks 21. Accordingly, the battery stacks 21 are connected in series.

According to such a connection structure, one of two battery stacks 21 located at the opposite ends of the battery stacks 21 arranged in the X direction becomes a highest potential battery stack 21, and the other becomes a lowest potential battery stack 21. An output terminal is connected to the positive electrode terminal 25 of the battery cell 22 having the highest potential among the battery cells 22 in the highest potential battery stack 21. An output terminal is connected to the negative electrode terminal 26 of the battery cell 22 having the lowest potential among the battery cells 22 in the lowest potential battery stack 21. These two output terminals are connected to an electric device mounted on the vehicle 10 such as the PCU 12.

Two battery stacks 21 adjacent to each other in the X direction may not be electrically connected via a predetermined wire. Any two of the battery stacks 21 arranged in the X direction may be electrically connected via a predetermined wire. The positive electrode terminal 25 and the negative electrode terminal 26 electrically connected via a predetermined wire may be same or different in position in the Y direction. That is, the positive electrode terminal 25 and the negative electrode terminal 26 may at least partially face each other or not face each other at all in the X direction. One of the positive electrode terminal 25 and the negative electrode terminal 26 may be at least partially located or be not located at all in a projected area obtained by projecting the other of the positive electrode terminal 25 and the negative electrode terminal 26 in the X direction.

Each bus bar cover 27 is formed of an electrically insulating material such as resin. The bus bar cover 27 is provided linearly from one end to the other end of the battery stack 21 along the Y direction such that the bus bar cover 27 cover the multiple bus bars 24. The bus bar cover 27 may have a partition wall. The partition wall enhances insulation between two bus bars 24 adjacent to each other in the Y direction.

The monitoring devices 30 are individually provided for the battery stacks 21. As shown in FIG. 2, a monitoring device 30 is arranged between the pair of bus bar units 23 on each of the battery stacks 21. The monitoring device 30 faces the end surface of the battery case in the Z direction, the positive electrode terminal 25 and the negative electrode terminal 26 protruding from the end surface. The monitoring device 30 and the end surface may be separated from each other in the Z direction or may face each other and be in contact with each other in the Z direction. An object such as an insulating sheet may be interposed between the monitoring device 30 and the end surface. The monitoring devices 30 are individually provided for each of the battery stacks 21.

The monitoring device 30 is fixed to the bus bar units 23 with a screw or the like. As will be described later, the monitoring device 30 is capable of performing wireless communication with the controller 40. An antenna 37, which will be described later, included in the monitoring device 30 is disposed so as not to overlap with the bus bar units 23 in the Z direction, that is, so as to protrude more than the bus bar units 23 in the Z direction.

A material of a coupling member such as a screw for coupling the monitoring device 30 and the bus bar units 23 may be, for example, a nonmagnetic material in order to avoid interference with wireless communication. In addition to the screw, among parts provided in the battery stack 21, a part that does not particularly need to have magnetism can adopt a nonmagnetic material as its constituent material.

In the present embodiment, the monitoring devices 30 are arranged in the X direction. The monitoring devices 30 are the same in position in the Y direction. With the configuration described above, extension of the separation intervals of the monitoring devices 30 are reduced.

The controller 40 is attached to an outer side surface of a battery stack 21 disposed at one end in the X direction. The controller 40 is capable of performing wireless communication with each monitoring device 30. An antenna 42, which will be described later, included in the controller 40 is disposed at about the same height as the antenna 37 of the monitoring device 30 in the Z direction. That is, the antenna 42 of the controller 40 is provided so as to protrude more than the bus bar units 23 in the Z direction.

In the battery pack 11, the monitoring devices 30 and the controller 40 provide a battery management system 60 described later. That is, the battery pack 11 includes the battery management system 60.

The housing 50 houses other elements constituting the battery pack 11, that is, the assembled battery 20, the monitoring devices 30, and the controller 40. Wireless communication between the monitoring devices 30 and the controller 40 is performed in an accommodation space of the housing 50. In order to avoid the battery pack 11 from becoming an electromagnetic noise source, it may be necessary to reduce leakage of radio waves of wireless communication to the outside of a communication space where wireless communication between the monitoring device 30 and the controller 40 is performed. Conversely, in order to reduce interference of the wireless communication, it may be necessary to reduce entry of electromagnetic noise into a communication space of the housing 50 from outside. The controller 40 may not be housed in the housing 50. Therefore, the communication space is not limited to the accommodation space of the housing 50. In other embodiments also, the controller 40 may or may not be housed in the housing 50.

For this reason, the housing 50 is capable of reflecting electromagnetic waves, for example. The housing 50 includes a material in order to reflect electromagnetic waves, described below as an example. For example, the housing 50 includes a magnetic material such as metal. The housing 50 includes a resin material and a magnetic material covering a surface of the resin material. The housing 50 includes a resin material and a magnetic material embedded in the resin material. The housing 50 includes carbon fibers. The housing 50 may be capable of absorbing electromagnetic waves instead of reflecting electromagnetic waves.

The housing 50 may have a hole communicating with an accommodation space inside the housing 50 and a space (external space) outside the housing 50. The hole is defined by a coupling surface that is between and connecting an inner surface and an outer surface of the housing 50. The hole is used for ventilation, extraction of a power line, and extraction of a signal line, for example. In the case of a configuration having a hole, a cover may be provided on the hole. The cover prevents communication between the accommodation space and the external space. The cover may block an entire or a part of the hole.

The cover is provided, for example, on either one of the inner surface, the outer surface, or the coupling surface of the housing 50. The cover may be disposed to face the hole so as to cover the hole, instead of being provided on either one of the inner surface, the outer surface, or the coupling surface. In a case where the cover and the hole are separated from each other, a separation gap therebetween is shorter than a length of the hole. The length of the hole is either a dimension between the inner surface and the outer surface, or a dimension in a direction orthogonal to the distance between the inner surface and the outer surface.

The cover is, for example, a connector, an electromagnetic shielding member, a sealing material, or the like. The cover includes a material described below as an example. The cover includes, for example, a magnetic material such as metal. The cover includes a resin material and a magnetic material covering a surface of the resin material. The cover includes a resin material and a magnetic material embedded in the resin material. The cover includes carbon fibers. The cover includes a resin material.

The hole of the housing 50 may be covered with at least one of elements accommodated in the accommodation space of the housing 50. A separation gap between the accommodated element and the hole is shorter than the length of the hole described above. The power line and the signal line may be disposed across the accommodation space and the external space while being held by an electrically insulating member forming a part of a wall of the housing 50.

<Battery Management System>

Figure 4:
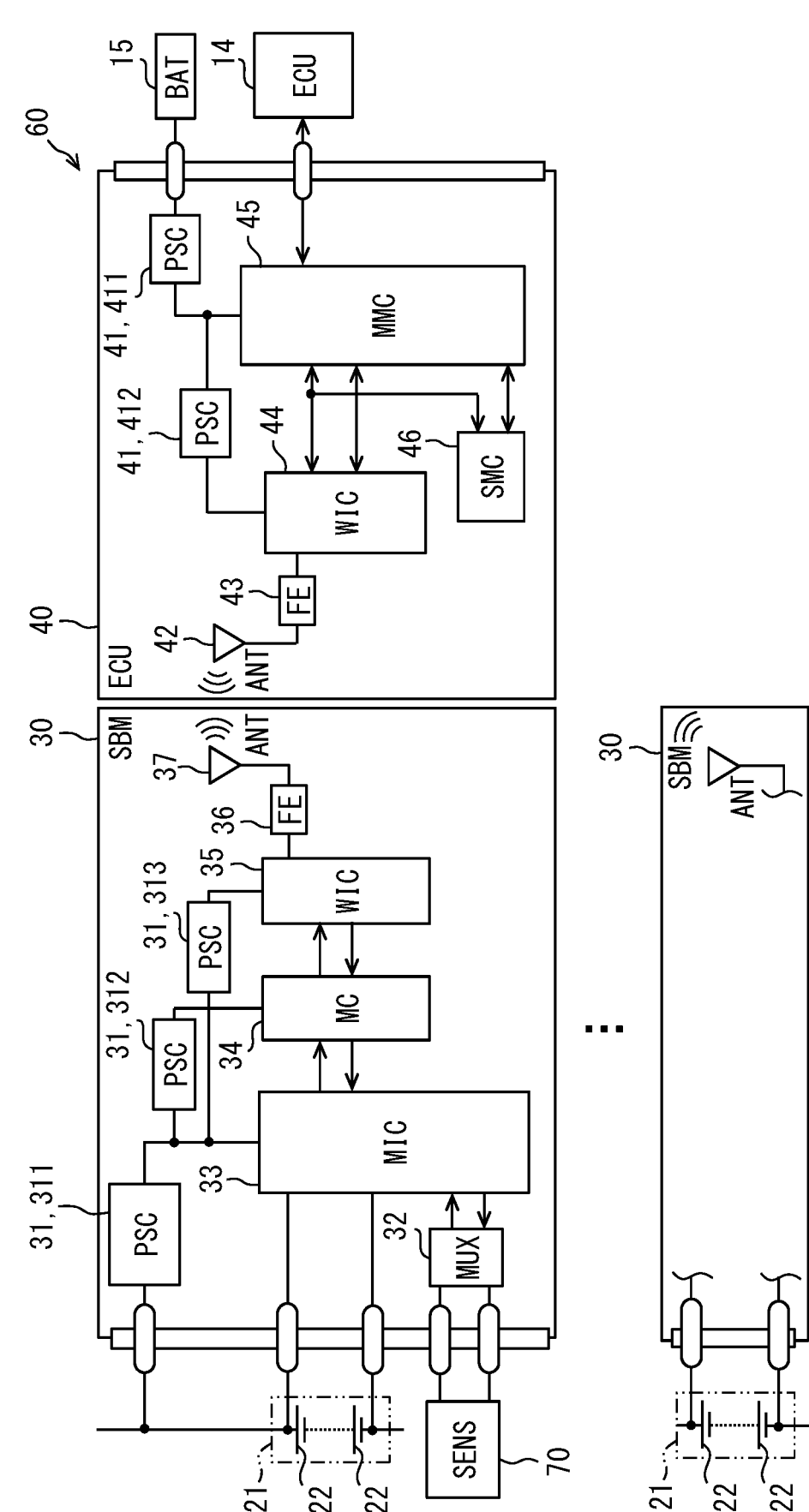
FIG. 4 is a block diagram showing a configuration of a battery management system according to a first embodiment.

Next, a schematic configuration of the battery management system will be described with reference to FIG. 4. FIG. 4 is a block diagram showing the configuration of the battery management system.

As shown in FIG. 4, the battery management system 60 includes the monitoring devices (SBMs) 30 and the controller (ECU) 40. In the following, a monitoring device may be referred to as SBM. The controller 40 may be referred to as a battery ECU or a BMU. BMU is an abbreviation for Battery Management Unit. The battery management system 60 is a system that manages batteries using wireless communication. This wireless communication uses a frequency band used in short-range communication, for example, a 2.4 GHz band or a 5 GHz band.

The battery management system 60 adopts one-to-one communication or network communication depending on the number of nodes of wireless communication performed by the monitoring devices 30 and/or the controller 40. The number of nodes may vary depending on resting states of the monitoring devices 30 and/or the controller 40. When the number of nodes is two, the battery management system 60 adopts one-to-one communication. When the number of nodes is 3 or more, the battery management system 60 adopts network communication. One example of network communication is star communication in which wireless communication is performed between one node as a master and the other nodes as slaves. Another example of network communication is chain communication in which multiple nodes are connected in series to perform wireless communication.

The battery management system 60 further includes a sensor 70. The sensor 70 includes a physical quantity detection sensor that detects a physical quantity of each battery cell 22, and a determination sensor. The physical quantity detection sensor includes a voltage sensor, a temperature sensor, and a current sensor, for example.

The voltage sensor includes a detection line coupled to a bus bar 24. The voltage sensor detects a voltage (cell voltage) of each of the battery cells 22. The determination sensor determines whether a correct battery is attached.

The temperature sensor is selectively provided in some of battery cells 22 included in a battery stack 21. The temperature sensor detects a temperature (cell temperature) of selected one of the battery cells 22 as a temperature of the battery stack 21. Among the battery cells 22 included in one battery stack 21, a battery cell 22 expected to have the highest temperature, a battery cell 22 expected to have the lowest temperature, a battery cell 22 expected to have an intermediate temperature are provided with the temperature sensor, for example. The number of temperature sensors for one battery stack 21 is not particularly limited.

The current sensor is provided in the battery stacks 21. The current sensor detects a current (cell current) commonly flowing through the battery cells 22 connected in series and the battery stacks 21 connected in series. In the present embodiment, one current sensor is provided because all the battery stacks 21 are connected in series. However, the number of current sensors is not limited to this example.

<Monitoring Device>

First, the monitoring devices 30 will be described. Each monitoring device 30 has a common configuration. The monitoring device 30 includes a power supply circuit (PSC) 31, a multiplexer (MUX) 32, a monitoring IC (MIC) 33, a microcontroller (MC) 34, a wireless IC (WIC) 35, a front end circuit (FE) 36, and the antenna (ANT) 37. Communication between elements within the monitoring device 30 is performed via wires.

The power supply circuit 31 uses a voltage supplied from the battery stacks 21 to generate operation power of other circuit elements included in the monitoring device 30. In the present embodiment, the power supply circuit 31 includes power supply circuits 311, 312, and 313. The power supply circuit 311 generates a predetermined voltage using the voltage supplied from the battery stacks 21 and supplies the generated voltage to the monitoring IC 33. The power supply circuit 312 generates a predetermined voltage using the voltage generated by the power supply circuit 311 and supplies the generated voltage to the microcontroller 34. The power supply circuit 313 generates a predetermined voltage using the voltage generated by the power supply circuit 311 and supplies the generated voltage to the wireless IC 35.

The multiplexer 32 is a selection circuit that selects one of detection signals of at least some of the sensors 70 included in the battery pack 11 and outputs the selected signal. The multiplexer 32 selects (switches) an input according to the selected signal from the monitoring IC 33 and outputs the input as one signal.

The monitoring IC 33 senses (i.e. acquires) battery information such as a cell voltage, a cell temperature and a cell determination result, and transmits the battery information to the microcontroller 34. For example, the monitoring IC 33 acquires the cell voltage directly from the voltage sensor, and acquires information such as the cell temperature through the multiplexer 32. The monitoring IC 33 acquires the cell voltage and determines which battery cell 22 corresponds to the cell voltage. The cell current detected by the current sensor may be input to the monitoring IC 33 or may be input to the controller 40 by wired transmission.

The monitoring IC 33 may be referred to as a cell monitoring circuit (CSC). CSC is an abbreviation for Cell Supervising Circuit. The monitoring IC 33 executes malfunction diagnosis of a circuit portion of the monitoring device 30 including the monitoring IC 33 itself. That is, the monitoring IC 33 transmits battery monitoring information including battery information and malfunction diagnosis information to the microcontroller 34. The monitoring device 30 may store (retain) the acquired battery monitoring information in a memory such as the microcontroller 34. When the monitoring IC 33 receives the data requesting for acquisition of the battery monitoring information transmitted from the microcomputer 34, the monitoring IC 33 senses the battery information through the multiplexer 32 and transmits the battery monitoring information including the battery information to the microcontroller 34. In addition to the above example, the battery monitoring information may include, for example, information such as a flue gas temperature, an impedance, a state of balancing of cell voltages, a stack voltage, a state of synchronization with the controller 40, or presence or absence of abnormality of detection wiring.

The microcontroller 34 is a microcomputer and includes a CPU as a processor, a ROM and a RAM as memories, an input/output interface, and a bus that connects these components. The CPU constructs multiple functional units by executing various programs stored in the ROM while using a temporary storage function of the RAM. ROM is abbreviation for Read Only Memory. The RAM is abbreviation for Random Access Memory.

The microcontroller 34 controls a schedule of sensing and self-diagnosis performed by the monitoring IC 33. The microcontroller 34 receives the battery monitoring information transmitted from the monitoring IC 33 and transmits the battery monitoring information to the wireless IC 35. The microcontroller 34 transmits data requesting acquisition of the battery monitoring information to the monitoring IC 33. For example, upon receiving the data requesting acquisition of the battery monitoring information transmitted from the wireless IC 35, the microcontroller 34 may transmit the data requesting acquisition of the battery monitoring information to the monitoring IC 33. The microcontroller 34 may autonomously request the monitoring IC 33 to acquire the battery monitoring information. For example, the microcontroller 34 may cyclically request the monitoring IC 33 to acquire the battery monitoring information.

The wireless IC 35 includes an RF circuit and a microcontroller (not illustrated) in order to wirelessly transmit and receive data. The microcontroller of the wireless IC 35 includes a memory. The wireless IC 35 has a transmission function of modulating transmission data and oscillating at a frequency of an RF signal. The wireless IC 35 has a reception function of demodulating reception data. RF is an abbreviation for Radio Frequency. The transmission data and the reception data can be collectively referred to as communication data.

The wireless IC 35 modulates the data including the battery monitoring information transmitted from the microcontroller 34, and transmits the modulated data to another node such as the controller 40 via the front end circuit 36 and the antenna 37. The wireless IC 35 adds data necessary for wireless communication such as communication control information to the transmission data including the battery monitoring information, and then transmits the data. The data necessary for wireless communication includes, for example, an identifier (ID) and an error detection code. The wireless IC 35 controls a data size, a communication format, a schedule, and error detection in wireless communication with another node, for example.

The wireless IC 35 receives data transmitted from another node via the antenna 37 and the front end circuit 36, and then demodulates the data. For example, upon receiving data including a transmission request for battery monitoring information, the wireless IC 35 transmits data including the battery monitoring information to the other node in response to the request. In addition to the battery monitoring information described above, the monitoring device 30 may transmit battery traceability information and/or manufacturing history information to the other node. The battery traceability information is, for example, the number of charge/discharge times, the number of malfunctions, and a total charge/discharge time. The manufacturing history information is, for example, a manufacturing date, a place, a manufacturer, a serial number, and a manufacturing number. The manufacturing history information is stored in a memory included in the monitoring device 30.

The front end circuit 36 includes a matching circuit for impedance matching between the wireless IC 35 and the antenna 37, and a filter circuit for removing unnecessary frequency components.

The antenna 37 converts an electric signal into radio waves and emits the radio waves into a space. The antenna 37 receives radio waves propagating in the space and converts the radio waves into an electric signal.

<Controller>

Next, the controller 40 will be described with reference to FIG. 4. The controller 40 includes a power supply circuit (PSC) 41, the antenna (ANT) 42, a front end circuit (FE) 43, a wireless IC (WIC) 44, a main microcontroller (MMC) 45, and a sub microcontroller (SMC) 46. Communication between elements inside the controller 40 is performed by wire.

The power supply circuit 41 uses a voltage supplied from a battery (BAT) 15 to generate an operating power source for other circuit elements included in the controller 40. The battery 15 is a DC voltage source mounted on the vehicle 10 and different from the battery pack 11. The battery 15 supplies electric power to an auxiliary machine of the vehicle 10, and therefore may be referred to as an auxiliary battery. In the present embodiment, the power supply circuit 41 includes power supply circuits 411 and 412. The power supply circuit 411 generates a predetermined voltage using the voltage supplied from the battery 15 and supplies the generated voltage to the main microcontroller 45 and the sub microcontroller 46. For simplification of the drawings, electrical connection between the power supply circuit 411 and the sub microcontroller 46 is omitted. The power supply circuit 412 generates a predetermined voltage using the voltage generated by the power supply circuit 411 and supplies the predetermined voltage to the wireless IC 44.

The antenna 42 converts an electric signal into radio waves and emits the radio waves into a space. The antenna 42 receives radio waves propagating in the space and converts the radio waves into an electric signal.

The front end circuit 43 includes a matching circuit for impedance matching between the wireless IC 44 and the antenna 42, and a filter circuit for removing unnecessary frequency components.

The wireless IC 44 includes an RF circuit and a microcontroller (not illustrated) in order to wirelessly transmit and receive data. The wireless IC 44 has a transmission function and a reception function like the wireless IC 35. The wireless IC 44 receives data transmitted from the monitoring device 30 via the antenna 42 and the front end circuit 43, and then demodulates the data. The wireless IC 44 transmits data including battery monitoring information to the main microcontroller 45. The wireless IC 44 receives and modulates data transmitted from the main microcontroller 45, and transmits the data to the monitoring device 30 via the front end circuit 43 and the antenna 42. The wireless IC 44 adds data necessary for wireless communication such as communication control information to the transmission data and transmits the data. The data necessary for wireless communication includes, for example, an identifier (ID) and an error detection code. The wireless IC 44 controls a data size, a communication format, a schedule, and error detection in wireless communication with other nodes.

The main microcontroller 45 is a microcomputer including a CPU, a ROM, a RAM, an input/output interface, and a bus that connects these components. The ROM stores various programs to be executed by the CPU. The main microcontroller 45 generates a command requesting the monitoring device 30 to perform predetermined process, and transmits transmission data including the command to the wireless IC 44.

The main microcontroller 45 generates, for example, a command for requesting transmission of battery monitoring information. The main microcontroller 45 may generate a command to request not only for transmission of battery monitoring information but also for acquisition of the battery monitoring information. The main microcontroller 45 may generate a command to request for transmission of battery monitoring information, a command to request for acquisition of the battery monitoring information. The request data transmitted from the controller 40 to the monitoring devices 30 may include these commands. The command to request for transmission of battery monitoring information corresponds to a request signal. The request signal may be a command to request not only for acquisition of battery monitoring information but also for transmission of the battery monitoring information. A request described herein may be referred to as an instruction.

The main microcontroller 45 receives data including battery monitoring information transmitted from the wireless IC 44, and performs predetermined process on the basis of the battery monitoring information. In the present embodiment, the main microcontroller 45 acquires a cell current from the current sensor, and performs predetermined process on the basis of the battery monitoring information and the acquired cell current. For example, the main microcontroller 45 performs a process of transmitting the acquired battery monitoring information to the ECU 14. The main microcontroller 45 may calculate at least one of the internal resistance, the open circuit voltage (OCV), the SOC, and the SOH of the battery cell 22 on the basis of the battery monitoring information, and transmit information including the calculated data to the ECU 14. OCV is an abbreviation for Open Circuit Voltage.

The main microcontroller 45 performs estimation process to estimate the internal resistance and the open circuit voltage of the battery cell 22 on the basis of, for example, the cell voltage and the cell current. The open circuit voltage is a cell voltage corresponding to the SOC of the battery cell 22. The open circuit voltage is a cell voltage when no current flows. The open circuit voltage and the cell voltage acquired by the monitoring device 30 have a difference by a voltage drop according to the internal resistance and the cell current. The internal resistance changes according to the cell temperature. The lower the cell temperature, the larger the value of the internal resistance. The main microcontroller 45 performs estimation process to estimate the internal resistance and the open circuit voltage of the battery cell 22 in also consideration of, for example, the cell temperature.

The main microcontroller 45 may instruct execution of balancing process for equalizing the voltages of the battery cells 22 on the basis of the battery monitoring information.

The main microcontroller 45 may acquire an IG signal of the vehicle 10 and perform the above-described processes according to the driving state of the vehicle 10. "IG" is an abbreviation of "Ignition". The main microcontroller 45 may perform process of detecting an abnormality of the battery cell 22 or the circuit on the basis of the battery monitoring information, and may transmit abnormality detection information to the ECU 14.

The sub-microcontroller 46 is a microcomputer including a CPU, a ROM, a RAM, an input/output interface, and a bus that connects these components. The ROM stores various programs to be executed by the CPU. The sub microcontroller 46 performs a monitoring process inside the controller 40. For example, the sub microcontroller 46 may monitor data between the wireless IC 44 and the main microcontroller 45. The sub microcontroller 46 may monitor a state of the main microcontroller 45. The sub-microcontroller 46 may monitor a state of the wireless IC 44.

<Arrangement and Communication Path>

Figure 5:
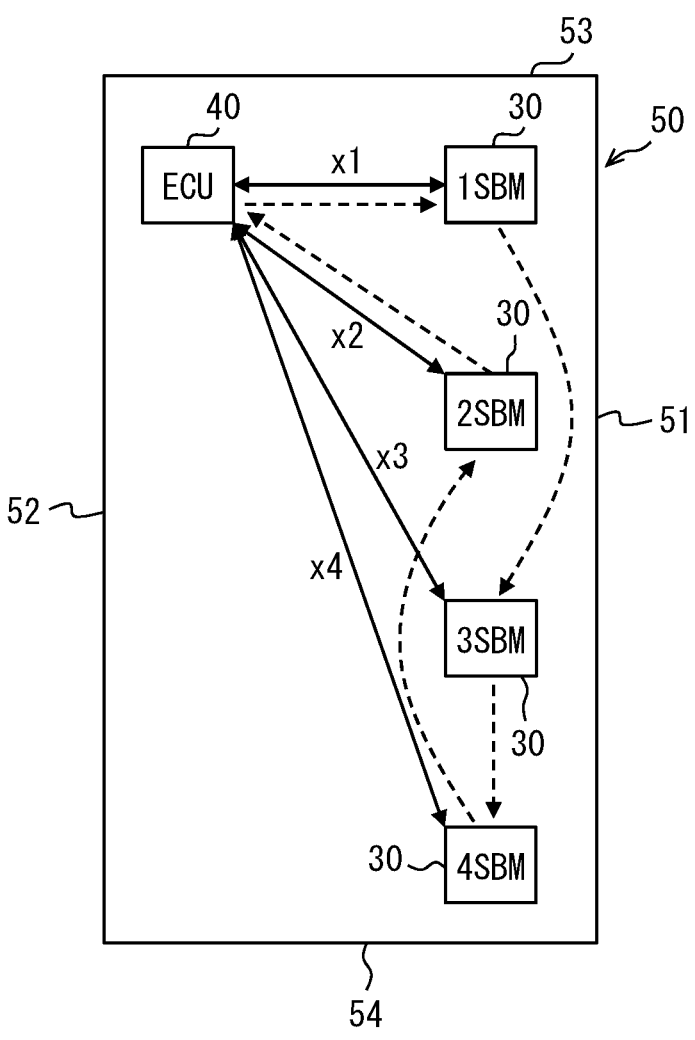
FIG. 5 is an image diagram showing a communication path according to the first embodiment.

Next, arrangement and a communication path of the monitoring devices 30 and the controller 40 will be described with reference to FIG. 5. FIG. 5 shows a distance relationship between each monitoring device 30 and the controller 40, and the communication path. In addition, in FIG. 5, in order to simplify the descriptions, four monitoring devices 30 are used. In FIG. 5, in order to distinguish between the four monitoring devices 30, they are shown as 1SBM, 2SBM, 3SBM, and 4SBM. 1SBM is referred to as a first monitoring device 30. 2SBM is referred to as a second monitoring device 30. 3SBM is referred to as a third monitoring device 30. 4SBM is referred to as a fourth monitoring device 30.

First, the arrangement will be described with reference to FIG. 5. In the present embodiment, the housing 50 has four side walls 51 to 54. Side walls 51 and 52 have a positional relationship facing each other. Side walls 53 and 54 have a positional relationship facing each other. The side walls 51 and 52 are along a longitudinal direction of the housing 50. The side walls 53 and 54 are along a transverse direction of the housing 50. The transverse direction may be perpendicular to the longitudinal direction.

The monitoring devices 30 are arranged to form a row along a side wall 51. The controller 40 is arranged at a position deviated from the row of the monitoring devices 30. However, a positional relationship between the controller 40 and each monitoring device 30 is not limited to this.

The solid lines in FIG. 5 show distances x1 to x4 between each monitoring device 30 and the controller 40. Theses distances x1 to x4 are the shortest distance between each monitoring device 30 and the controller 40. Further, these distances x1 to x4 may be the shortest distance between the antennas 37 of each monitoring device 30 and the antenna 42 of the controller 40.

In the example shown in FIG. 5, the distance x4 between the controller 40 and the fourth monitoring device 30 is longer than the other distances x1 to x3. Therefore, the fourth monitoring device 30 is positioned to be the farthest from the controller 40 among all the monitoring devices 30.

Therefore, in the present embodiment, the fourth monitoring device 30 corresponds to a far device. However, the present disclosure is not limited to this. The far device changes depending on the positional relationship between each monitoring device 30 and the controller 40. Further, a monitoring device can be adopted as the far device as long as a distance from the controller 40 to the monitoring device is longer than distances from the controller 40 to a receiving device and a transmitting device described later. The fourth monitoring device 30 is different from the receiving device and the transmitting device described later. Further, the far device is determined by linear distances between each monitoring device 30 and the controller 40. However, the far device may be determined by distances of bypass paths instead of the linear distances. This point is the same in an inspection system described later. That is, the positional relationship between the far device and the receiving and transmitting devices is the same as a positional relationship between an inspection far device and inspection transmitting and receiving devices which will be described later.

Next, the communication path will be described with reference to FIG. 5. The broken lines in FIG. 5 indicate the communication path of wireless communication. The battery management system 60 of the present embodiment performs chain communication when the number of nodes is 4 or more. Each node is connected to via a broken line to and wirelessly communicates with a node.

The communication path is a path through which wireless communication is performed in the chain communication. Thus, the communication path is a path in which wireless communication is performed from the controller 40 through each monitoring device 30 one by one to the controller 40. The communication path indicates the order of nodes in which wireless communication is performed in the chain communication. Further, the communication path indicates pairs among the nodes in which wireless communication is sequentially performed in the chain communication. The order of the monitoring devices 30 is not limited to a predetermined one, and can be changed. This point is the same in the inspection system described later.

The broken arrows each indicate a direction of data transmission via wireless communication. In other words, the broken arrow directions each indicate a destination of the wireless communication. The broken lines may be the directions of packet transmission.

The controller 40 and the monitoring devices 30 each have two nodes as wireless communication partners, which are a transmission destination and a transmission source of wireless communication. For example, there are two wireless communication partners of the controller 40, which are the first monitoring device 30 and the second monitoring device 30. The controller 40 and the monitoring devices 30 wirelessly communicate with each other according to the predetermined communication path. In the example shown in FIG. 5, the communication path is configured such that wireless communication is performed in the order of the controller 40, the first monitoring device 30, the third monitoring device 30, the fourth monitoring device 30, the second monitoring device 30, and the controller 40. Thus, the battery management system 60 is configured such that one-way wireless communication is performed from the controller 40 through each monitoring device 30 one by one to the controller 40.

That is, the controller 40 and the monitoring devices 30 each transmit data or the like to a preset transmission partner (i.e. node) via wireless communication. Further, the communication partners of the controller 40 and the monitoring devices 30 are predetermined.

More specifically, in each of the controller 40 and the monitoring devices 30, an ID of the transmission partner of is preset. An ID of the first monitoring device 30 is set in the controller 40. An ID of the third monitoring device 30 is set in the first monitoring device 30. An ID of the fourth monitoring device 30 is set in the third monitoring device 30. An ID of the second monitoring device 30 is set in the fourth monitoring device 30. An ID of the controller 40 is set in the second monitoring device 30. Therefore, when the controller 40 and the monitoring devices 30 transmit an advertisement packet and battery monitoring information described later, each of the controller 40 and the monitoring devices 30 transmits the advertisement packet and the battery monitoring information including the preset ID of the transmission partner.

In the battery management system 60 in which the communication path is set in this way, the first monitoring device 30 which is one of the monitoring devices 30 receives the request data from the controller 40. Further, in the battery management system 60, the second monitoring device 30, which is one of the monitoring devices 30, transmits battery monitoring information to the controller 40. Therefore, in the present embodiment, the first monitoring device 30 corresponds to the receiving device, and the second monitoring device 30 corresponds to the transmitting device. However, the present disclosure is not limited to this. The receiving device and the transmitting device are determined by a set communication path. The receiving device and the transmitting device are different monitoring devices 30. Further, the roles of the receiving device, the transmitting device, and the far device can be arbitrarily given to all the monitoring devices 30. This point is the same in the inspection system described later.

<Periodic Communication Process>

Figure 6:
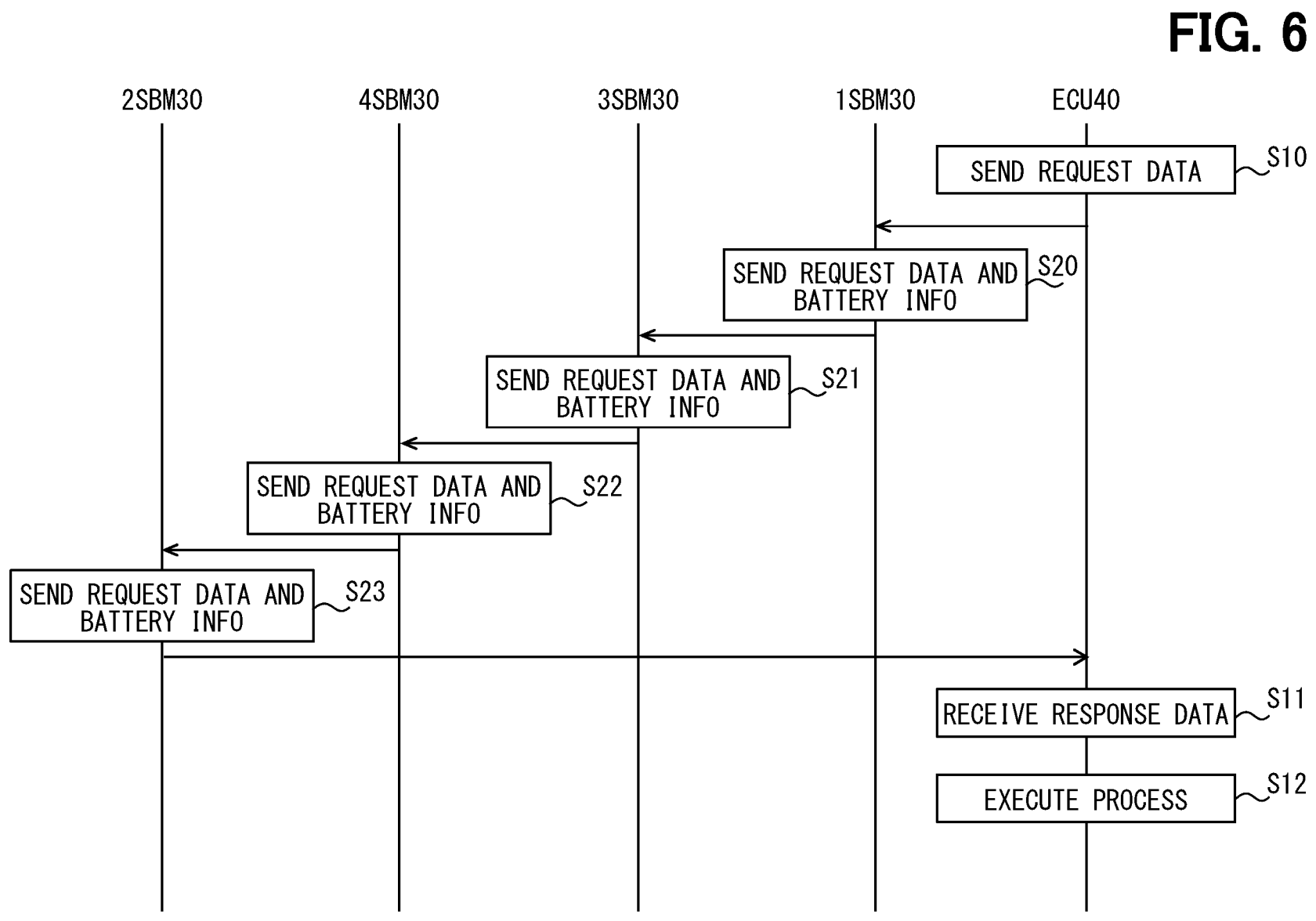

Next, a periodic communication process will be described with reference to FIG. 6. FIG. 6 is a diagram illustrating a communication sequence of wireless communication between the nodes. The communication sequence may be referred to as a communication flow. FIG. 6 illustrates also an example of the periodic communication process.

In FIG. 6, it is assumed that each node has completed the connection process with a predetermined communication partner. The connection process includes a connection establishment process and a pairing process. One of the two nodes to communicate with each other performs a scanning operation, and the other performs an advertising operation.

Each node performs an advertising operation in order to inform the communication partner of its existence. That is, the node performing the advertising operation transmits an advertisement packet including an ID of the communication partner. The advertisement packet also includes an ID of the node performing the advertising operation.

The other node performing the scanning operation detects the advertisement packet. That is, the other node detects the communication partner by the scanning operation. The other node performing the scanning operation transmits a connection request to the detected communication partner.

When the node performing the advertising operation receives the connection request, the connection is established between the two nodes. The node performing the advertising operation stops transmitting the advertisement packet when the connection is established. The node performing the advertising operation cyclically transmits the advertisement packet until the connection is established.

When the connection establishment process ends, a pairing process is subsequently performed. The pairing process is a process for performing encrypted data communication. The pairing process includes a unique information exchange process. In this exchange process, unique information held by each other is exchanged and stored. After the exchange process is performed, encryption using the exchanged unique information becomes possible. The unique information is, for example, key information, or information for generating a key.

When the connection process is completed, each node executes the periodic communication process. In step S10, the controller 40 transmits the request data to the first monitoring device 30 which is the transmission partner. The controller 40 corresponds to a transmission portion. As an example, the controller 40 transmits the request data including a command to request for transmission of battery monitoring information. In this way, the controller 40 transmits the request data to the first monitoring device 30 which is one of the monitoring devices 30. The controller 40 receives the request data via the wireless IC 35, the front end circuit 36, and the antenna 37.

When the first monitoring device 30 receives the request data from the controller 40, the first monitoring device 30 transmits the request data and battery monitoring information in step S20. At this time, the first monitoring device 30 transmits the request data and the battery monitoring information to the third monitoring device 30 which is a transmission partner. The first monitoring device 30 transmits the battery monitoring information acquired by the first monitoring device 30 itself. The battery monitoring information acquired by the first monitoring device 30 itself is the battery monitoring information acquired by the monitoring IC 33 provided in the first monitoring device 30. That is, the battery monitoring information is not battery information received via wireless communication. The same applies to the battery monitoring information acquired by each monitoring device 30 described below.

When the third monitoring device 30 receives the request data from the first monitoring device 30, the third monitoring device 30 transmits the request data and battery monitoring information in step S21. At this time, the third monitoring device 30 transmits the request data and the battery monitoring information to the fourth monitoring device 30 which is a transmission partner. Further, the third monitoring device 30 transmits the battery monitoring information received from the first monitoring device 30 in addition to battery monitoring information acquired by itself. That is, the third monitoring device 30 transmits the battery monitoring information acquired by itself and the battery monitoring information acquired by the first monitoring device 30.

When the fourth monitoring device 30 receives the request data from the third monitoring device 30, the fourth monitoring device 30 transmits the request data and battery monitoring information in step S22. The fourth monitoring device corresponds to a transfer portion. At this time, the fourth monitoring device 30 transmits the request data and the battery monitoring information to the second monitoring device 30 which is a transmission partner. Further, the fourth monitoring device 30 transmits the battery monitoring information received from the third monitoring device 30 in addition to battery monitoring information acquired by itself. That is, the fourth monitoring device 30 transmits the battery monitoring information acquired by itself, the battery monitoring information acquired by the first monitoring device 30 and the battery monitoring information acquired by the third monitoring device 30.

In this way, the fourth monitoring device 30 receives the request data through the first monitoring device 30. In the present embodiment, the fourth monitoring device 30 receives the request data not only through the first monitoring device 30 but also through the third monitoring device 30. Further, the fourth monitoring device 30 transmits the battery monitoring information to the controller 40 through the second monitoring device 30.

When the second monitoring device 30 receives the request data from the fourth monitoring device 30, the second monitoring device 30 transmits the request data and battery monitoring information in step S23. At this time, the second monitoring device 30 transmits the request data and the battery monitoring information to the controller 40 which is a transmission partner. Further, the second monitoring device 30 transmits the battery monitoring information received from the fourth monitoring device 30 in addition to battery monitoring information acquired by itself.

That is, the second monitoring device 30 transmits the battery monitoring information acquired by itself and the battery monitoring information acquired by the first monitoring device 30, the third monitoring device 30, and the fourth monitoring device 30. Therefore, the second monitoring device 30 collectively transmits the battery monitoring information acquired by each of the monitoring devices 30 to the controller 40. Further, the data summarizing the electronic monitoring information acquired by each of the monitoring devices 30 is also referred to as response data.

The controller 40 receives the response data from the second monitoring device 30 in step S11. The controller 40 corresponds to a reception portion. Therefore, the controller 40 receives the battery monitoring information of all the monitoring devices 30. The controller 40 and each monitoring device 30 periodically perform the above-mentioned data communication with the communication partner for which the connection has been established. Then, the controller 40 executes a predetermined process based on the received response data, that is, the battery monitoring information (step S12). The controller 40 receives the response data via the wireless IC 35, the front end circuit 36, and the antenna 37. The controller 40 may include a wireless IC 35, a front end circuit 36, and an antenna 37 for transmission, and include a wireless IC 35, a front end circuit 36, and an antenna 37 for reception.

The battery monitoring information transmitted in steps S20 to S23 is, for example, already acquired at the time of reception of the request data. In other words, it is the battery monitoring information held by each monitoring device 30. That is, in response to the request data received at the present time, each monitoring device 30 transmits the battery monitoring information that has been acquired according to previously received request data. However, the present disclosure is not limited to this. Each monitoring device 30 acquires battery monitoring information upon receiving the request data. Then, in response to the request data received at the present time, each monitoring device 30 may transmit the battery monitoring information acquired according to the request data received at the present time.

Further, each monitoring device 30 transmits battery monitoring information upon receiving the request data. Therefore, the battery monitoring information corresponds to battery monitoring information responding to the received request signal.

As described above, in the present embodiment, an example is adopted in which each monitoring device 30 acquires the battery monitoring information in response to the request data including the command to request for transmission of the battery monitoring information. However, the present disclosure is not limited to this. Each monitoring device 30 may acquire the battery monitoring information according to request data including a command to request for acquisition of the battery monitoring information. Further, each monitoring device 30 may autonomously acquire battery monitoring information.

The battery management system 60 performs at least steps S10, S11, S22. Further, in a battery management method of the present disclosure, the controller 40 transmits the request data to the first monitoring device 30, and receives the response data from the second monitoring device 30. In the battery management method, the fourth monitoring device 30 receives the request data through the first monitoring device 30, and the fourth monitoring device 30 transmits the battery monitoring information to the controller 40 through the second monitoring device 30 in response to the received request data. The battery management system 60 of the present disclosure can be replaced with the battery management method.

<Effects>

As described above, the fourth monitoring device 30 is arranged at the position farthest from the controller 40 among all the monitoring devices 30. Therefore, the fourth monitoring device 30 is more likely to fail in wireless communication with the controller 40 than the other monitoring devices 30.

Therefore, the fourth monitoring device 30 receives the request data via the first monitoring device 30. Further, the fourth monitoring device 30 transmits the battery monitoring information to the controller 40 through the second monitoring device 30 in response to the received request data. As described above, the fourth monitoring device 30 does not directly perform wireless communication with the controller 40. As a result, the battery management system 60 can reduce a frequency of failure in transmission of the battery monitoring information from the fourth monitoring device 30 to the controller 40. That is, the battery management system 60 can more reduce the frequency of failure in transmission of the response data to the controller 40 than a configuration in which the fourth monitoring device 30 acts as the transmission device and transmits the response data to the controller 40. Similarly, the battery management system 60 can more reduce the frequency of failure in transmission of the request data from the controller 40 than a configuration in which the controller 40 transmits the request data to the fourth monitoring device 30. Further, the battery management system 60 can reduce the frequency of failure in transmission of response data only by setting the communication path (i.e. transmission partners).

In addition, the response data includes battery monitoring information acquired by all of the monitoring devices 30. Therefore, the response data has the longest data length among the data transmitted through the communication path. However, in the battery management system 60, the fourth monitoring device 30 does not transmit the response data, and the second monitoring device 30 transmits the response data. Therefore, the battery management system 60 can reduce the frequency of failure in wireless communication as compared with a configuration in which the fourth monitoring device 30 transmits the response data.

In a general battery management system, a communication path is set in the order of arrangement of monitoring devices. For example, in the arrangement shown in FIG. 5, the communication path can be configured such that wireless communication is performed in the order of the controller 40, the first monitoring device 30, the second monitoring device 30, the third monitoring device 30, the fourth monitoring device 30, and the controller 40 or vice versa. According to this communication order, the communication path of the battery management system can be simplified.

However, the battery management system 60 uses the communication path in which the fourth monitoring device 30 does not directly perform wireless communication with the controller 40, even though the communication path may become complicated. As a result, the battery management system 60 can exert the above-mentioned effects. The battery management method can have the same effects as the battery management system 60 described above.

(Modifications)

Figure 7:
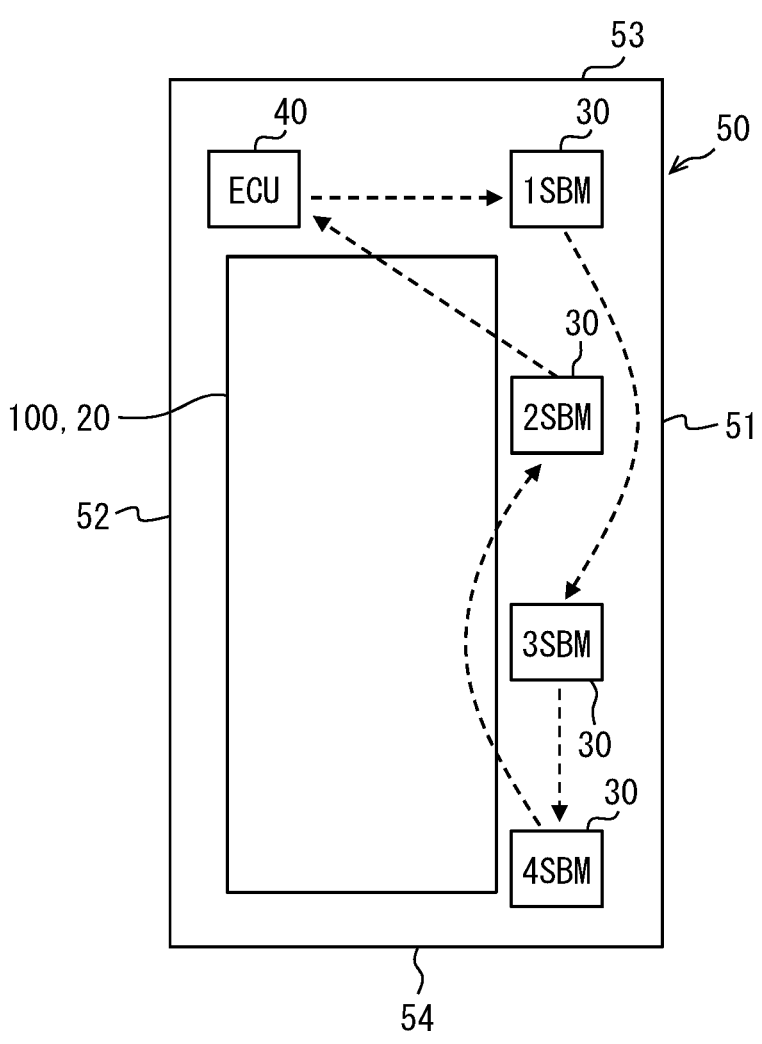
FIG. 7 is an image diagram illustrating a communication path according to a modification.

As shown in FIG. 7, in the battery management system 60, an obstacle 100 may be arranged in vicinity of each node. The assembled battery 20 is adopted as an example of the obstacle 100. The vicinity of each node is a facing region between nodes or an adjacent region adjacent to the facing region between nodes, for example.

The obstacle 100 is an object that obstructs wireless communication between each node. More specifically, the obstacle 100 includes a magnetic member, such as a battery case of the battery cells 22, the conductive bus bar 24, and conductive wires connecting the battery stacks 21. Further, the obstacle 100 shields or reflects radio waves of wireless communication. The obstacle 100 is an object that causes communication failure of wireless communication between nodes. Further, the obstacle 100 is an object that deteriorates a communication quality.

If a communication failure occurs or a communication quality drops below a set value, data transmitted and received between nodes may not be transmitted or received, or a part of the data may be missing. The deterioration of communication quality means, for example, a state in which the received signal strength (i.e. RSSI) is lower than a predetermined value. In addition, the deterioration of communication quality indicates a state in which a Cyclic Redundancy Check error (i.e. CRC error) occurs, a state in which data cannot be transmitted/received, or a state in which a part of data is missing. Therefore, in the present disclosure, even if an object is arranged between the nodes, the object is not the obstacle 100 as long as the object does not deteriorate the communication quality.

Second Embodiment

The second embodiment will be described with reference to FIG. 8. In the present embodiment, portions different from the first embodiment will be mainly described. The second embodiment is different from the first embodiment in that a battery management system 60 includes a configuration of monitoring devices 30, a configuration of a controller 40, and multiple communication systems. A housing 50 houses an assembled battery 20, eight monitoring devices 30, and the controller 40. In order to distinguish between the eight monitoring devices 30, they are shown as 1SBM, 2SBM, 3SBM, 4SBM, 11SBM, 12SBM, 13SBM, and 14SBM. 11SBM is referred to as an eleventh monitoring device 30. 12SBM is referred to as a twelfth monitoring device 30. 13SBM is referred to as a thirteenth monitoring device 30. 14SBM is referred to as a fourteenth monitoring device 30. The number of monitoring devices 30 is not limited to the above.

An obstacle region is formed in which an obstacle 100 may be placed. The obstacle region includes node regions having the same shapes as outer shapes of two different nodes and a facing region between the two nodes. This obstacle region has, for example, a rectangular cuboid shape. The obstacle region may be a region that can be a path for radio waves in, for example, wireless communication performed between nodes.

The obstacle region is formed at least in the housing 50. The obstacle region may be formed outside the housing 50.

Figure 8:
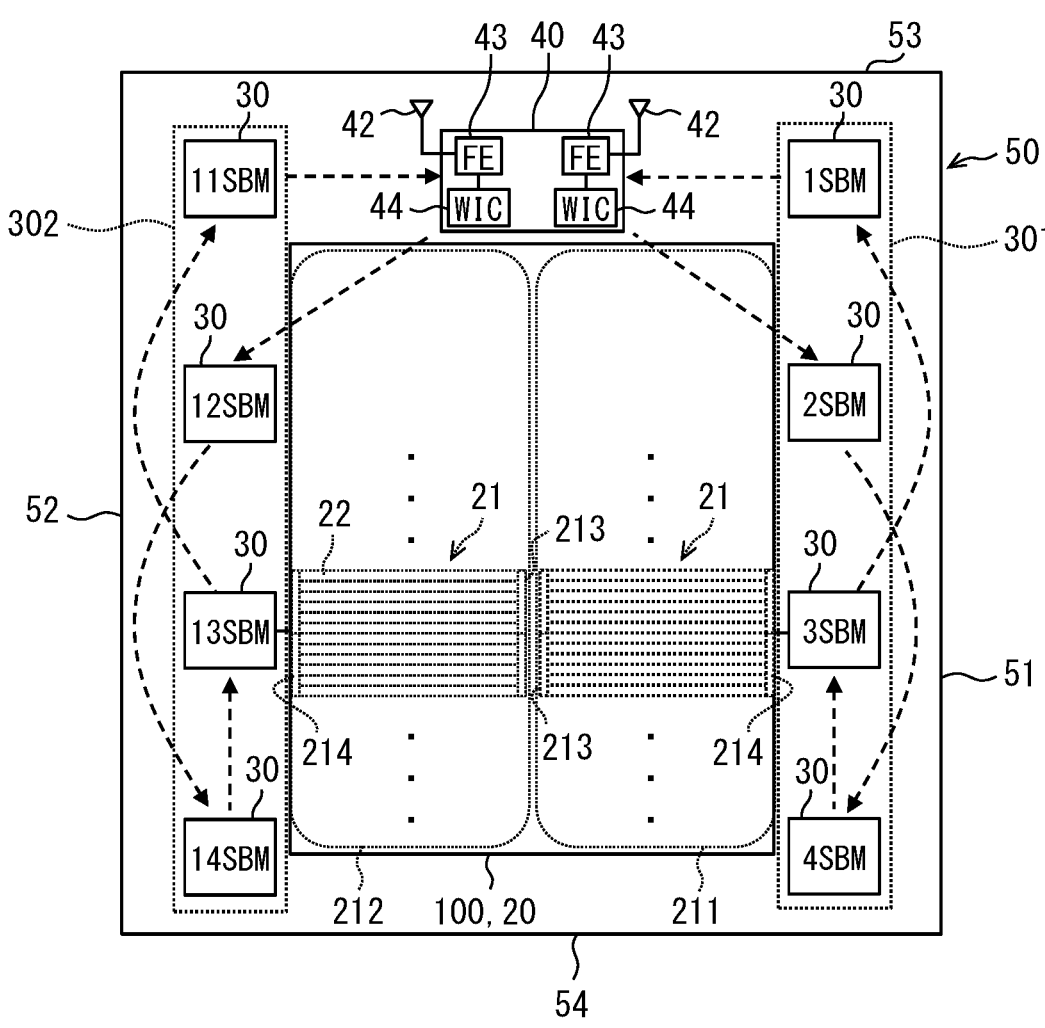
FIG. 8 is a schematic diagram of a top view illustrating the battery pack according to a second embodiment.

For example, as shown in FIG. 8, when all of the monitoring device 30 and the controller 40 are arranged on the same plane inside the housing 50, the obstacle region has a rectangular cuboid shape with height same as the thickness of the monitoring devices 30 and having a bottom surface and a top surface covering all of the monitoring devices 30 and the controller 40.

Alternatively, for example, when all the monitoring devices 30 are arranged on the same plane inside the housing 50 and the controller 40 is arranged outside the housing 50, the obstacle region includes a region having a rectangular cuboid shape with height same as the thickness of the monitoring devices 30 and having a bottom surface and a top surface covering all of the monitoring devices 30. Further, in this case, in addition to the rectangular cuboid-shaped region, the obstacle region includes a node region having the same shape as the outer shape of the controller 40, and a facing region between each monitoring device 30 and the controller 40.

Within the obstacle region, the obstacle 100 may be arranged and include the assembled battery 20, a battery case of battery cells 22, a conductive bus bar 24, and conductive wires connecting battery stacks 21. Further, a part of the housing 50 may be arranged in the obstacle region. The part of the housing 50 also includes a protrusion and a recess provided on the housing 50.

The battery management system 60 includes two arrangement regions 301, 302 in which the monitoring devices 30 are arranged. Each of the arrangement regions 301, 302 is at least a part between side walls 53, 54.

A first arrangement region 301 is provided along a side wall 51. The first arrangement region 301 is located nearer to the side wall 51 than to a side wall 52. That is, the first arrangement region 301 is provided at a position displaced from a middle point between the side wall 51 and the side wall 52 toward the side wall 51. The first arrangement region 301 is provided within a predetermined range in a direction from the side wall 51 to the side wall 52. The first arrangement region 301 corresponds to a first region.

On the other hand, a second arrangement region 302 is provided along the side wall 52. The second arrangement region 302 is located nearer to the side wall 52 than to a side wall 51. That is, the second arrangement region 302 is provided at a position displaced from the middle point between the side wall 51 and the side wall 52 toward the side wall 52. The second arrangement region 302 is provided within a predetermined range in a direction from the side wall 52 to the side wall 51. The second arrangement region 302 corresponds to a second region.

The first to fourth monitoring devices 30 are arranged in the first arrangement region 301. The first to fourth monitoring devices 30 are arranged along the side wall 51 as in the above embodiment. The eleventh to fourteenth monitoring devices 30 are arranged in the second arrangement region 302. The eleventh to fourteenth monitoring devices 30 are arranged along the side wall 52.

The present disclosure employs an example in which the two arrangement regions 301, 302 are provided. However, in the present embodiment, at least two arrangement regions may be provided. Therefore, in the present embodiment, three or more arrangement regions may be provided. Each arrangement region may be provided along the side walls 53, 54, i.e. along the transverse direction of the housing 50. Each arrangement region may be provided along the side walls 53, 54 and the side walls 51, 52, i.e. along both the longitudinal direction and the transverse direction of the housing 50. Each arrangement region may be provided without being along the side walls 51 to 54. Further, at least one monitoring device 30 may be arranged in each arrangement region.

The assembled battery 20 is arranged between the first arrangement region 301 and the second arrangement region 302. In the assembled battery 20, for example, the multiple battery stacks 21 are arranged side by side in the direction from the side wall 53 to the side wall 54. Further, in each battery stack 21, for example, multiple battery cells 22 are arranged side by side in the direction from the side wall 53 to the side wall 54.

In the assembled battery 20, the multiple battery stacks 21 are arranged in two rows. For example, the assembled battery 20 includes two stack rows 211, 212 in each of which four battery stacks 21 are arranged side by side in the direction from the side wall 53 toward the side wall 54. The two stack rows 211, 212 are arranged side by side in a direction from the side wall 51 to the side wall 52. In other words, the two stack rows include a first stack row 211 that is located nearer to the side wall 51 than to the side wall 52, and a second stack row 212 that is nearer to the side wall 52 than to the side wall 51.

Each battery stack 21 has one end 213 facing an adjacent stack row, and another end 214 facing the side wall 51, 52. That is, each battery stack 21 of the first stack row 211 has one end 213 facing the second stack row 212, and another end 214 facing the side wall 51. Each battery stack 21 of the second stack row 212 has one end 213 facing the first stack row 211, and another end 214 facing the side wall 52.

The end 214 of each battery stack 21 facing the side wall 51, 52 is wall-side end that faces a wall. Further, the ends 214 of the battery stacks 21 included in the first stack row 211 is an end 214 of the first stack row 211. Similarly, the ends 214 of the battery stacks 21 included in the second stack row 212 is an end 214 of the second stack row 212.

Therefore, the first to fourth monitoring devices 30 are arranged between a virtual plane along the end 214 of the first stack row 211 and the side wall 51. Similarly, the eleventh to fourteenth monitoring devices 30 are arranged between a virtual plane along the end 214 of the second stack row 212 and the side wall 52.

The first arrangement region 301 and the second arrangement region 302 are provided at different ends of the assembled battery 20. Therefore, the monitoring devices 30 are arranged side by side at both ends of the assembled battery 20. The first to fourth monitoring devices 30 are arranged along one end of the assembled battery 20. The eleventh to fourteenth monitoring devices 30 are arranged along another end of the assembled battery 20. Each monitoring device 30 may be arranged inside a facing region of the assembled battery 20 or may be arranged outside the facing region. This facing region is a region overlapping with the assembled battery 20 in the direction from the side wall 51 to the side wall 52.

As described in the above modification, the assembled battery 20 becomes an obstacle 100. Therefore, the obstacle 100 is arranged in a space between the first arrangement region 301 and the second arrangement region 302. The space between the first arrangement region 301 and the second arrangement region 302 includes a facing region between the first arrangement region 301 and the second arrangement region 302, and an adjacent region adjacent to the facing region.

The configuration of the assembled battery 20 and the arrangement of the monitoring devices 30 described above are merely examples. The present embodiment can be applied also to other configurations and arrangements. For example, each monitoring device 30 may not be arranged between the assembled battery 20 and the side walls 51, 52. In this case, as shown in FIG. 2, each monitoring device 30 may be arranged so as to be mounted on the assembled battery 20 (battery stack 21). In this case, the first to fourth monitoring devices 30 are arranged, for example, on upper surfaces of the battery stacks 21 of the first stack row 211, respectively. The first to fourth monitoring devices 30 may be adjacent to the end 214 of the first stack row 211 facing the side wall 51. The eleventh to fourteenth monitoring devices 30 are arranged, for example, on upper surfaces of the battery stacks 21 of the second stack row 212, respectively. The eleventh to fourteenth monitoring devices 30 may be adjacent to the end 214 of the second stack row 212 facing the side wall 52. Further, in the assembled battery 20, the battery stacks 21 may be arranged in one row.

The battery management system 60 includes two communication systems.

The battery management system 60 includes a first communication system including the first to fourth monitoring devices 30 arranged in the first arrangement region 301, and a second communication system including the eleventh to fourteenth monitoring devices 30 arranged in the second arrangement region 302. Each communication system includes a receiving device, a transmitting device, and a far device. In the first communication system, the second monitoring device 30 corresponds to the receiving device, the first monitoring device 30 corresponds to the transmitting device, and the fourth monitoring device 30 corresponds to the far device. In the second communication system, the twelfth monitoring device 30 corresponds to the receiving device, the eleventh monitoring device 30 corresponds to the transmitting device, and the fourteenth monitoring device 30 corresponds to the far device.

The response data has the longest data length among data transmitted through communication path. Therefore, the transmitting device may be the monitoring device 30 arranged closest to the controller 40. In the present embodiment, the first monitoring device 30 and the eleventh monitoring device 30 are used as the transmitting devices. Therefore, the battery management system 60 can reduce a frequency of failure in wireless communication as compared with a configuration in which the other monitoring device 30 transmits the response data. This configuration can also be applied to other embodiments.

The monitoring devices 30 included in each communication system and the controller 40 perform chain communication. Therefore, in the first communication system, chain communication is performed between the first to fourth monitoring devices 30 and the controller 40. In this case, the communication path can be configured such that wireless communication is performed in the order of the controller 40, the second monitoring device 30, the fourth monitoring device 30, the third monitoring device 30, the first monitoring device 30, and the controller 40. On the other hand, in the second communication system, chain communication is performed between the eleventh to fourteenth monitoring devices 30 and the controller 40. In this case, the communication path can be configured such that wireless communication is performed in the order of the controller 40, the twelfth monitoring device 30, the fourteenth monitoring device 30, the thirteenth monitoring device 30, the eleventh monitoring device 30, and the controller 40.

In the present embodiment, the two communication systems are used. However, in the present disclosure, three or more communication systems may be provided. Further, each communication system may include four or more nodes.

The controller 40 performs wireless communication with monitoring devices 30 in each communication system. Therefore, in the present embodiment, the controller 40 has the same number of communication functions as the number of communication systems. That is, the controller 40 includes an antenna 42, a front end circuit 43, and a wireless IC 44 for the first communication system, and an antenna 42, a front end circuit 43, and a wireless IC 44 for the second communication system.

However, the present embodiment is not limited to this, and even a controller 40 including only one set of the antenna 42, the front end circuit 43, and the wireless IC 44 may be used. In this case, the battery management system 60 performs communications in a time-division manner with each monitoring device 30 of the first system and with each monitoring device 30 of the second system.

The controller 40 is arranged between the assembled battery 20 and the side wall 53. Further, the controller 40 may be arranged so as to be mounted on the assembled battery 20 (battery stack 21).

The battery management system 60 of the second embodiment has the same effects as those of the above embodiment. Further, the battery management system 60 divides the communication system into multiple systems. Therefore, when the total number of monitoring devices 30 is fixed, the battery management system 60 can shorten data length of response data as compared with a configuration in which wireless communication is performed by only one communication system. Therefore, the battery management system 60 can reduce a frequency of failure in wireless communication as compared with the configuration in which wireless communication is performed by only one communication system. Further, since the battery management system 60 divides the communication system into multiple systems, it is easy to avoid arrangement of an obstacle 100 between nodes.

Third Embodiment

Figure 9:
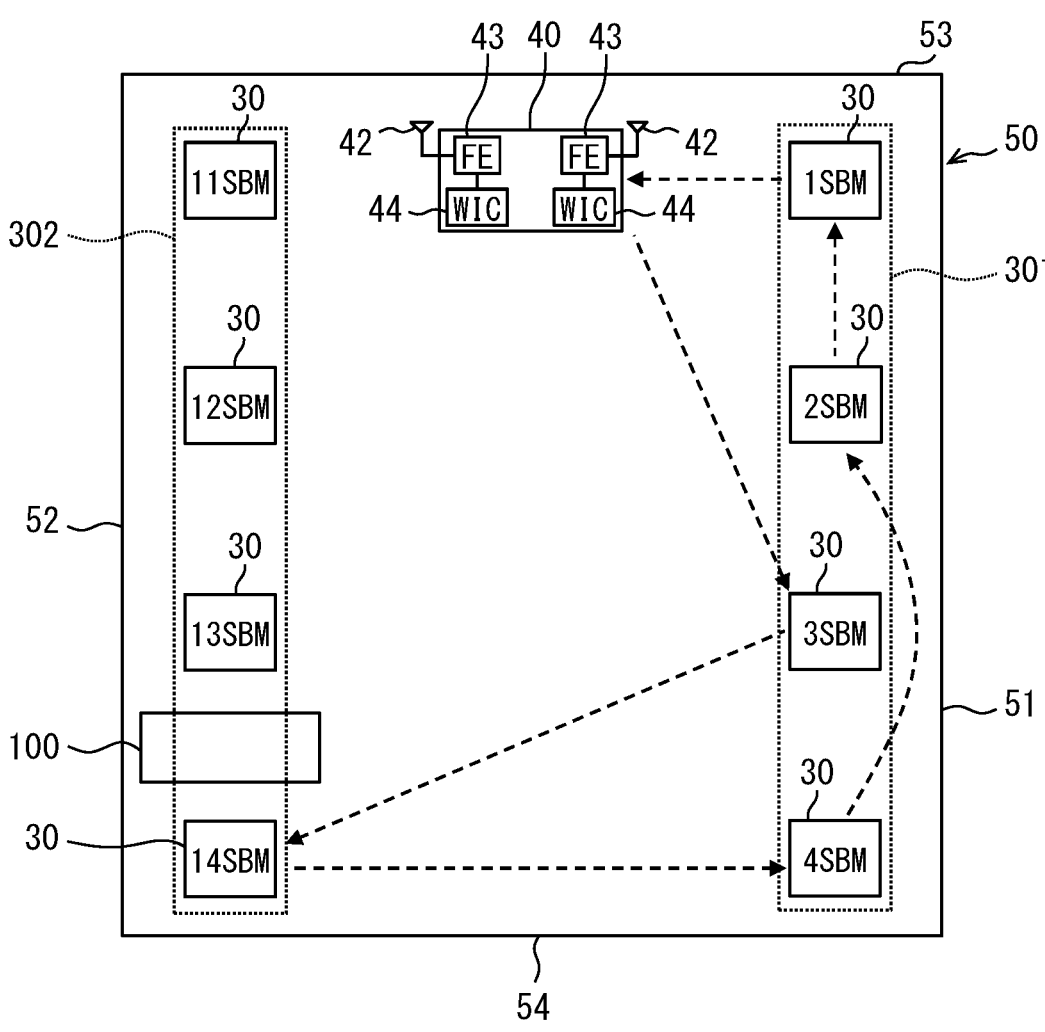
FIG. 9 is a schematic diagram of a top view illustrating the battery pack according to a third embodiment.

A third embodiment will be described with reference to FIG. 9. In the present embodiment, portions different from the second embodiment will be mainly described. In the third embodiment, the configuration of the communication system is different from that of the second embodiment. In FIG. 9, illustration of an assembled battery 20 is omitted.

As shown in FIG. 9, an obstacle 100 is arranged between a thirteenth monitoring device 30 and a fourteenth monitoring device 30. Therefore, there is a high possibility that wireless communication will fail between the thirteenth monitoring device 30 and the fourteenth monitoring device 30. On the other hand, no obstacle 100 is arranged between the fourteenth monitoring device 30 and the third monitoring device 30, and between the fourteenth monitoring device 30 and the fourth monitoring device 30.

Therefore, in the battery management system 60, a communication path is set so as to prevent the wireless communication from being obstructed by the obstacle 100. That is, in the battery management system 60, the communication path is set so that the fourteenth monitoring device 30 arranged in a second arrangement region 302 wirelessly communicates with the third monitoring device 30 and the fourth monitoring device 30. Therefore, a first communication system includes the fourteenth monitoring device 30 in addition to first to fourth monitoring devices 30. On the other hand, a second communication system does not include the fourteenth monitoring device 30, but includes eleventh to thirteenth monitoring devices 30.

The fourth monitoring device 30 and the fourteenth monitoring device 30 have the same distance from the controller 40. The fourth monitoring device 30 and the fourteenth monitoring device 30 is longer in distance from the controller 40 than first to third monitoring devices 30. Therefore, in the first communication system, the fourth monitoring device 30 and the fourteenth monitoring device 30 correspond to far device. Further, in the first communication system, a third monitoring device 30 corresponds to a receiving device, and a first monitoring device 30 corresponds to a transmitting device. Hence, although the fourteenth monitoring device 30 is adjacent to the obstacle 100 that obstacles wireless communication, the fourteenth monitoring device 30 wirelessly communicates with monitoring devices 30 through a communication paths that bypass the obstacle 100. In this case, monitoring devices 30 connected to the fourteenth monitoring device 30 through the communication paths that bypass the obstacle 100 are third and fourth monitoring devices 30.

Various components arranged inside the battery pack 11 (i.e. housing 50) can be obstacles 100. However, in the battery management system 60, the communication path is set so as to prevent the wireless communication from being obstructed by the obstacles 100. Therefore, the battery management system 60 can reduce a frequency of failure in wireless communication. The battery management system 60 of the present embodiment has the same effects as those of the second embodiment.

In the present embodiment, the obstacle 100 is arranged between the monitoring devices 30. However, the present embodiment is not limited to this, and an obstacle 100 may be arranged between a monitoring device 30 and the controller 40. Even if there is an obstacle 100 between nodes, the nodes are set to perform wireless communication therebetween so as to bypass the obstacle 100.

In the present embodiment, two communication systems are provided. However, in the present embodiment, only one communication system or three or more communication systems may be provided. Further, the technical contents of the present embodiment can be applied to the other embodiments.

Fourth Embodiment

Figure 10:
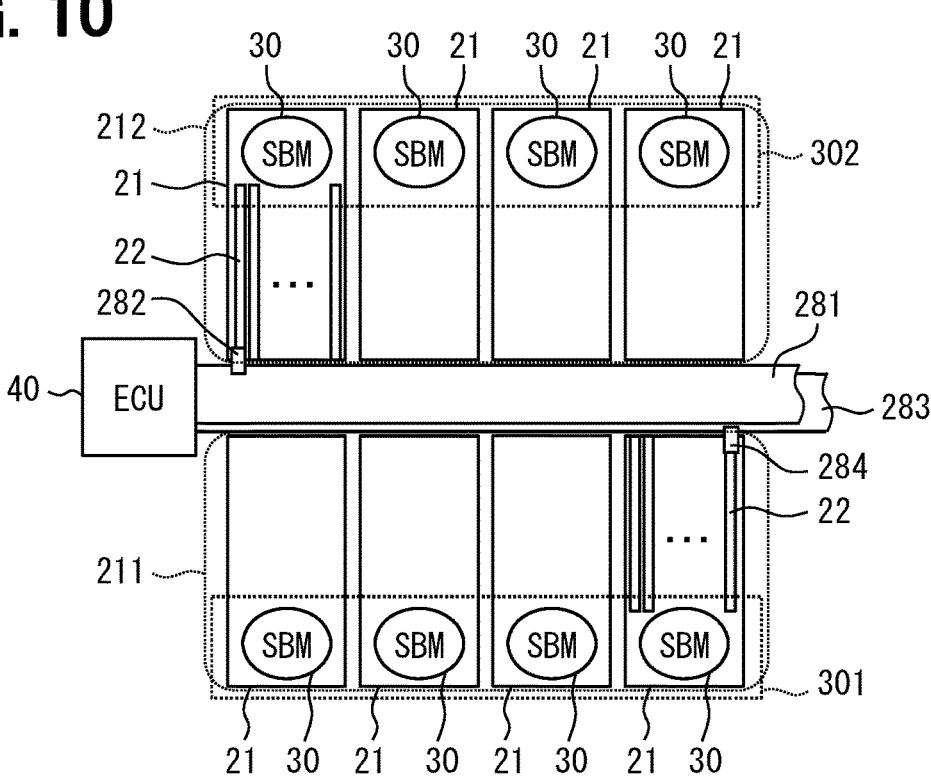
FIG. 10 is a schematic diagram of a top view illustrating the battery pack according to a fourth embodiment.

A fourth embodiment will be described with reference to FIG. 10. In the present embodiment, portions different from the second embodiment will be mainly described. The fourth embodiment is different from the second embodiment in that a bus bar is provided as an obstacle 100 between arrangement regions. In FIG. 10, illustration of an assembled battery 20 is omitted.

As shown in FIG. 10, in a battery management system 60, a positive electrode bus bar 281 and a negative electrode bus bar 283 are arranged between a first arrangement region 301 and a second arrangement region 302. Further, the positive electrode bus bar 281 and the negative electrode bus bar 283 are arranged in a space between a first stack row 211 and a second stack row 212. The space between the first stack row 211 and the second stack row 212 includes a facing region between the first stack row 211 and the second stack row 212, and an adjacent region adjacent to the facing region.

For example, the positive electrode bus bar 281 and the negative electrode bus bar 283 are plate-shaped bus bars. The positive electrode bus bar 281 and the negative electrode bus bar 283 are provided along an arrangement direction of battery stacks 21 in the stack rows 211, 212. Further, each bus bar 281,283 extends in the same direction as an arrangement direction of battery cells 22 in the battery stacks 21.

The positive electrode bus bar 281 is electrically connected to the controller 40 and a highest-potential battery cell 22. The positive electrode bus bar 281 is electrically connected to the highest-potential battery cell 22 via a connection bus bar 282. The negative electrode bus bar 283 is electrically connected to the controller 40 and a lowest-potential battery cell 22. The negative electrode bus bar 283 is electrically connected to the lowest-potential battery cell 22 via a connection bus bar 284.

The highest potential battery cell 22 is a battery cell 22 having the highest potential among the battery cells 22 included in the assembled battery 20. On the other hand, the lowest potential battery cell 22 is a battery cell 22 having the lowest potential among the battery cells 22 included in the assembled battery 20.

Further, the positive electrode bus bar 281 may be integrated with the connection bus bar 282 so as to form an integral body. Similarly, the negative electrode bus bar 283 may be integrated with the connection bus bar 284 so as to form an integral body.

The battery management system 60 of the present embodiment has the same effects as those of the second embodiment. The configuration of the present embodiment can be applied to other embodiments.

Fifth Embodiment

A fifth embodiment will be described with reference to FIGS. 11 and 12. In the present embodiment, portions different from the first embodiment will be mainly described. The fifth embodiment is different from the first embodiment in that a communication path is switched. In the present embodiment, monitoring devices 30 and a controller 40 are arranged in the same arrangement as in FIG. 5.

As described above, in the battery management system 60, a communication path including a far device, a receiving device, and a transmitting device is preset. In the present embodiment, it is assumed that the communication path used in the first embodiment (FIG. 5) is set in advance.

Further, the communication path is set so that wireless communication is normally performed in consideration of the obstacle 100. Normally, the communication path is set at a factory or a dealer. The communication path set here is an initial path which is an initial value of the communication path. Further, an environment for setting the initial paths are referred to as an initial setting environment.

However, the battery management system 60 may be mounted on a mobile body such as a vehicle. In this case, the surrounding environment of the battery management system 60 changes as the vehicle moves. In the following, a vehicle will be adopted as an example of a mobile body.

In the battery management system 60, a communication state of wireless communication between nodes also changes as the surrounding environment changes. In other words, a success rate of transmission and reception in wireless communication may vary depending on the surrounding environment.

Therefore, in the battery management system 60, even if the communication path is set so that the wireless communication is normally performed, the success rate of transmission and reception in the wireless communication changes as the vehicle moves. That is, the battery management system 60 may not be an optimum communication path due to the movement of the vehicle. The optimum communication path is a communication path through which wireless communication is normally performed.

Therefore, each monitoring device 30 and the controller 40 perform a switching process for switching the preset communication path. Each monitoring device 30 and the controller 40 start a flowchart shown in FIG. 11, for example, when an ignition switch of the vehicle is switched from OFF to ON. Each monitoring device 30 and the controller 40 execute the flowchart of FIG. 11. In the following, each monitoring device 30 and the controller 40 are collectively referred to as a node.

Each node performs a transmission and reception process at S30 in order to confirm a communication quality. That is, each node performs wireless communication with two communication partners in a predetermined communication path. For example, the third monitoring device 30 receives data transmitted from the first monitoring device 30 and also transmits data to the fourth monitoring device 30. The data transmitted and received here can be referred to as evaluation data. The evaluation data may be, for example, response data, request data (i.e. request signal), or the like. However, the evaluation data is not limited to this specific example.

At step S32 (communication quality process unit), each node performs communication quality evaluation as a communication quality process. Each node evaluates a communication quality of its own wireless communication. Each node evaluates the quality of the communication performed the present time based on the transmission and reception result obtained at step S30. Each node evaluates whether the communication quality is normal or deteriorated. Then, at step S34 (accumulation unit), each node accumulates the evaluation results of the communication quality as an communication record.

More specifically, each node may evaluate communication quality deterioration, for example, when the response data cannot be received. Although each node can receive data, the communication quality may be determined to be deteriorated as a result of the evaluation when a communication error is detected by an inspection executed at the time of reception, for example, an inspection using an error detection code. Each node may evaluate the communication quality to be deteriorated, for example, when a retransmission process is necessary. That is, when communication is not established, the communication quality may be evaluated to be deteriorated. Each node may evaluate the communication quality to be deteriorated, for example, when the received signal strength (i.e. RSSI) is lower than a predetermined value. RSSI is an abbreviation for Received Signal Strength Indicator. Each node evaluates the communication quality to be normal when the evaluation criteria are met.

Each node may evaluate the communication quality by acquiring information on a reception status of the request data as a part of the communication data from a node that is a communication partner. Each node evaluates the communication quality based on the information regarding the reception status of the request data and/or information regarding the reception status of the response data, and accumulates the communication records.

Each node accumulates a communication record every time the process of step S34 is executed. The communication record is an evaluation record of a normal communication quality or an evaluation record of a deteriorated communication quality. In this way, each node accumulates communication records. The communication records are the accumulated evaluation results.

Then, at step S36 (determination unit), each node determines whether the communication records>the threshold value. Each node compares the communication records with the threshold value in order to determine whether to switch the communication path from the initial path. The threshold value is a value for determining whether wireless communication in the communication path can be normally performed. Further, the threshold value is also a value for determining whether the node continues to be in a state in which wireless communication in the communication path cannot be normally performed.

When it is determined that the communication records>the threshold value, each node determines that the wireless communication cannot be normally performed in the initial paths, and the process proceeds to step S38. That is, when it is determined that the communication records>the threshold value, each node determines to switch the communication path from the initial path.

Figure 11:
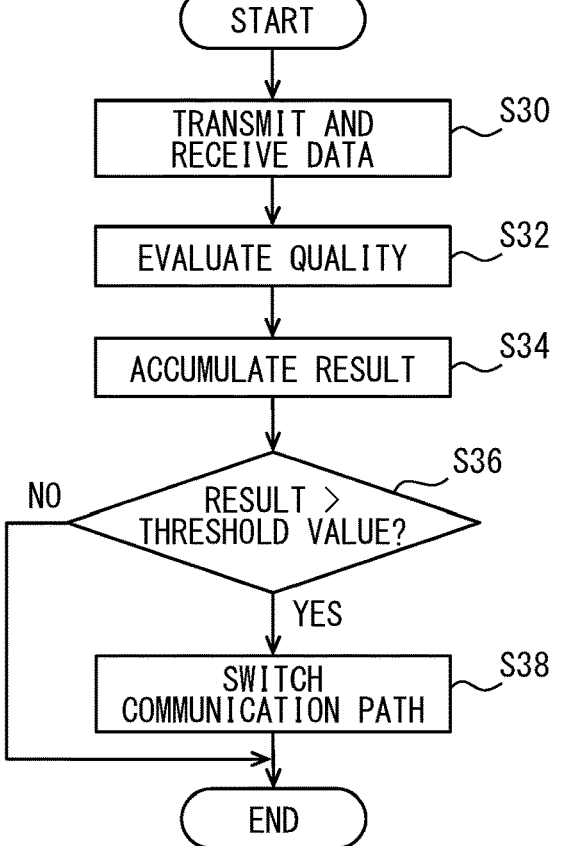
FIG. 11 is a flowchart illustrating processing operations in a controller and monitoring devices according to a fifth embodiment.

On the other hand, when it is determined that the communication records≤the threshold value, each node determines that wireless communication can be normally performed even in the initial paths, and ends the flowchart of FIG. 11. That is, when it is determined that the communication record≤the threshold value, each node determines not to switch the communication path from the initial path.

Each node switches the communication path at step S38 (switching unit). Each node switches the communication path according to the communication quality. That is, each node switches the communication path when it is determined that the communication path needs to be switched according to the communication quality.

Figure 12:
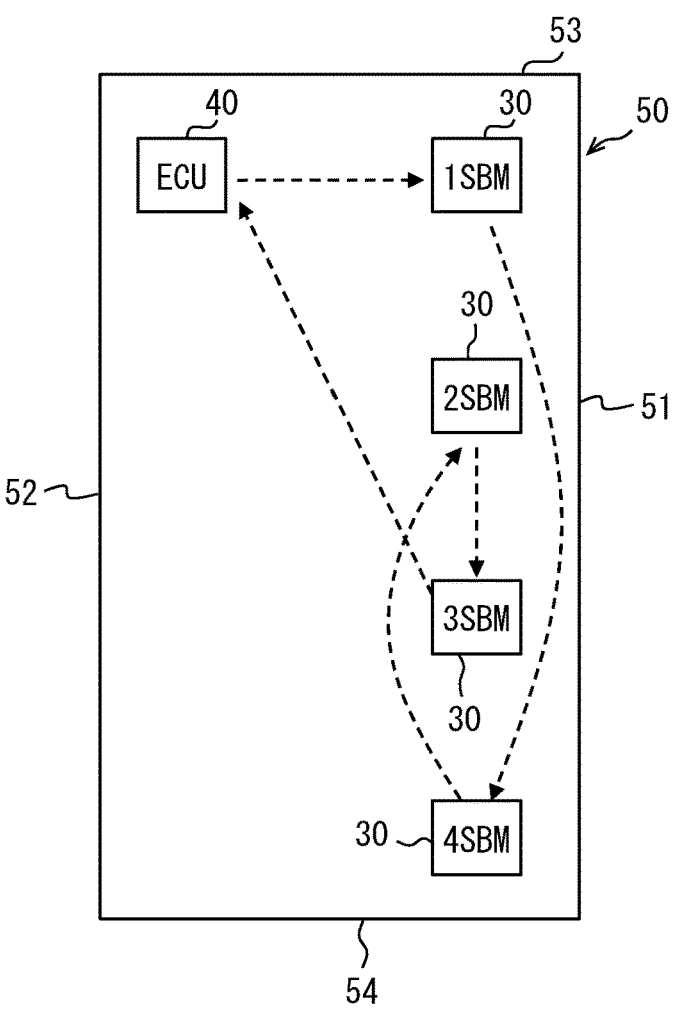
FIG. 12 is an image diagram showing a communication path according to the fifth embodiment.

For example, the communication path (initial path) shown in FIG. 5 is switched to the communication path shown in FIG. 12. In FIG. 12, the communication path is configured such that wireless communication is performed in the order of the controller 40, the first monitoring device 30, the fourth monitoring device 30, the second monitoring device 30, the third monitoring device 30, and the controller 40.

In this case, the first to third monitoring devices 30 change the IDs of the transmission partners. The first monitoring device 30 changes the ID of the transmission partner from the ID of the third monitoring device 30 to the ID of the fourth monitoring device 30. The second monitoring device 30 changes the ID of the controller 40 to the ID of the third monitoring device 30. The third monitoring device 30 changes the ID of the fourth monitoring device 30 to the ID of the controller 40.

As a result, the transmitting device is changed from the second monitoring device 30 to the third monitoring device. However, even in the changed communication path, the far device is the fourth monitoring device 30, which is the same as in the initial path. Therefore, even if the communication path is changed, the fourth monitoring device 30 does not directly perform wireless communication with the controller 40.

Multiple communication paths that are candidates for the changed communication path may be stored in advance in a ROM of each node. In this case, at step S38, each node selects one communication path from the multiple communication paths and sets it as a new communication path. Further, at step S38, each node may select one communication path from the multiple communication paths based on the communication records and set it as a new communication path. The communication paths stored in advance are path candidates.

Each node may create a changed communication path based on the communication records and set it as a new communication path. In this case, it is not necessary to store multiple path candidates in the ROM of each node. Therefore, each node does not need to increase the capacity of the ROM in order to store the path candidates.

Further, in the battery management system 60, when a predetermined condition is met, each monitoring device 30 does not need to acquire battery monitoring information. The predetermined condition is, for example, when the vehicle is not running. Therefore, the controller 40 may perform the switching process only in a non-running period of the vehicle. The non-running period is a period of time during which acquisition of battery monitoring information is unnecessary. In other words, the controller 40 may perform the switching process only when it is no longer necessary to acquire the battery monitoring information. That is, the controller 40 performs the switching process when it detects that the vehicle has become a non-running state.

The non-running period is, for example, when the ignition switch is turned off, when a system main relay is turned off, or when the assembled battery 20 is inactive. The system main relay is, for example, a relay provided between the battery pack 11 and the PCU 12. In addition, the non-running period may be, for example, when the vehicle is stopped, when a driver gets out of the vehicle, or when each door of the vehicle is locked. Therefore, when the controller 40 detects that the ignition switch has been turned off, the controller 40 determines that the vehicle has become the non-running state and performs the switching process. Since the switching process is executed in the non-running period, the battery management system 60 can prevent the assembled battery 20 (battery stacks 21, battery cells 22) from becoming unmonitored.

The controller 40 may perform the switching process at predetermined time intervals when the ignition switch is turned on. Accordingly, in the battery management system 60, the communication path easily follows changes in the surrounding environment of the vehicle. That is, in the battery management system 60, wireless communication between each node can be normally performed even if the surrounding environment of the vehicle changes from the initial setting environment.

The controller 40 may perform the switching process every time the number of times the ignition switch is switched from off to on reaches a predetermined numbers of times. As a result, in the battery management system 60, the communication path can easily follow changes in the surrounding environment of the vehicle while reducing a frequency of an unmonitored state of the assembled battery 20 during the vehicle running. That is, in the battery management system 60, the assembled battery 20 can be prevented from being in an unmonitored state during the vehicle running, as compared with a case where the switching process is performed at predetermined time intervals when the ignition switch is turned on. Further, in the battery management system 60, the communication path is more likely to follow changes in the surrounding environment of the vehicle than in a case where the switching process is performed when the vehicle is not running or when the ignition switch is switched from OFF to ON.

The timing of the switching process is not limited to the above. The controller 40 may perform the switching process at a timing different from the above timing.

The battery management system 60 of the present embodiment has the same effects as those of the first embodiment. Further, the battery management system 60 can normally perform wireless communication between each node even if the surrounding environment of the vehicle changes from the initial setting environment. The configuration of the present embodiment can be applied to other embodiments.

Each node of the battery management system 60 uses the communication quality as information for determining whether it is necessary to switch the communication path. The communication quality is information obtained by actually performing wireless communication as described above. Therefore, each node can determine whether it is necessary to switch the communication path based on an actual state of wireless communication. Therefore, each node can appropriately switch the communication path. That is, each node can be prevented from performing unnecessary switching of the communication path or not performing necessary switching of the communication path.

Further, in the battery management system 60, since the processes of steps S34 and S36 are executed, erroneous determination whether to switch the communication path can be reduced. However, the present embodiment is not limited to this, and the processes of steps S34 and S36 may be omitted. Each node may perform a process of step S38 when the evaluation result of the communication quality obtained at step S32 is a result that switching of the communication path is regarded as necessary. The result that the switching of the communication path is regarded as necessary is, for example, deterioration of the communication quality. Hence, the battery management system 60 can immediately switch the communication path. In the present embodiment, as an example, an example in which all the nodes perform the switching process is adopted. However, the present disclosure is not limited to this, and another example may be adopted as long as at least one of each monitoring device 30 and the controller 40 performs the switching process. For example, only the controller 40 may perform the switching process. In other words, an example can be adopted, in which at least one of each monitoring device 30 and the controller 40 performs the evaluation (S32) of the communication quality and the switching (S38) of the communication path.

Sixth Embodiment

A sixth embodiment will be described with reference to FIG. 13. In the present embodiment, portions different from the first embodiment will be mainly described. The sixth embodiment is different from the first embodiment in that the battery management system 60 is applied to an inspection system.

<Inspection System>

The assembled battery 20 (battery cell 22) described above is inspected (i.e. diagnosed) and determined whether the assembled battery 20 is reusable by an inspection device 80 while the assembled battery 20 is removed from the vehicle 10. As shown in FIG. 13, the inspection device 80 and the battery management system 60 removed from the vehicle 10 together with the assembled battery 20 establish an inspection system 90. The inspection device 80 inspects the assembled battery 20. The inspection system 90 includes at least one of battery management systems 60 removed from the vehicle 10 and the inspection device 80.

An inspection of the battery cell 22 by the inspection device 80 may be performed individually for the battery management systems 60, but it is efficient to perform the inspection for the multiple battery management systems 60 collectively. In the example shown in FIG. 13, the inspection system 90 includes three battery management systems 60 (60A, 60B, 60C), and the inspection device 80 collectively inspects the battery cells 22 corresponding to the battery management systems 60A, 60B, 60C.

The inspection by the inspection device 80 is performed in a workplace such as a factory, a dealer, or a warehouse. The factory has various obstacles 100 such as production lines, equipment, machines, walls, and shelves. Similarly, dealers and warehouses have various obstacles 100 such as equipment, machines, walls, and shelves. Therefore, in such a workplace, it is difficult to perform wireless communicate between the inspection device 80 and each monitoring device 30 individually. That is, it is difficult to stabilize the state of wireless communication between the inspection device 80 and each monitoring device 30.

Further, the inspection by the inspection device 80 collectively inspects battery cells 22 corresponding to the multiple battery management systems 60. Therefore, in the inspection by the inspection device 80, the number of target battery cells 22 is larger than the number of battery cells 22 mounted on one vehicle. Therefore, it takes a lot of man-hours to perform wireless communication between the inspection device 80 and each monitoring device 30 individually.

Therefore, in the inspection system 90, the inspection device 80 performs chain communication including the monitoring devices 30 via wireless communication, and acquires battery monitoring information for inspection. As shown in FIG. 13, the communication path shown by broken lines are set between the inspection device 80 and the monitoring devices 30 before the inspection, and then wireless communication is performed.

The monitoring devices 30 are monitoring devices removed from the multiple battery management systems 60. Therefore, the communication path at the time of inspection by the inspection device 80 are different from the communication path at the time of being mounted on the vehicle. The communication path at the time of inspection by the inspection device 80 corresponds to a communication path for inspection.

Figure 13:
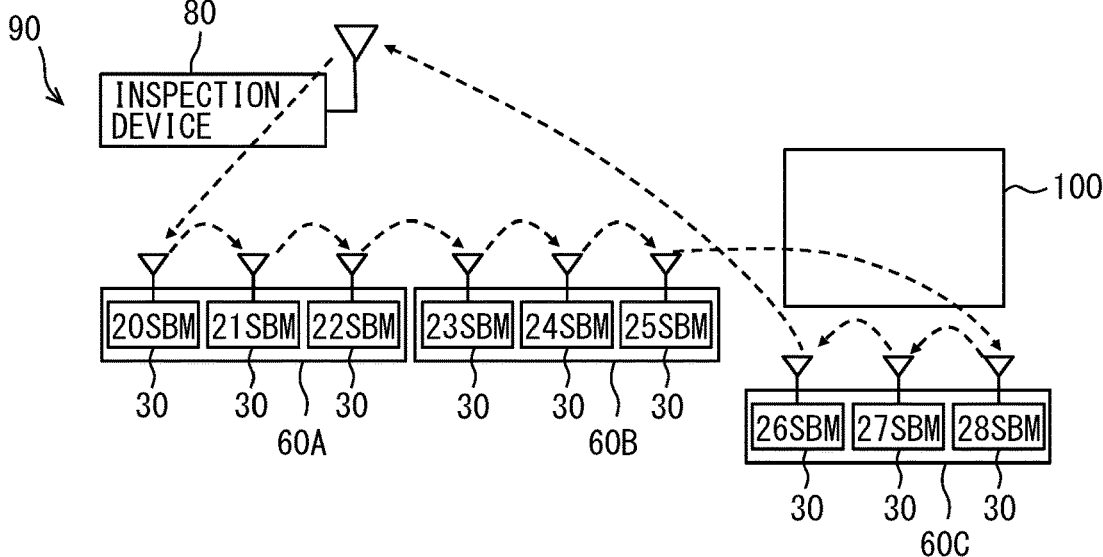
FIG. 13 is a diagram illustrating an inspection system according to a sixth embodiment.

In the example of the communication path at the time of inspection in FIG. 13, the communication path are configured such that wireless communication is performed in the order of the inspection device 80, the twentieth monitoring device 30 to the twenty-fifth monitoring device 30, the twenty-eighth monitoring device 30, the twenty-seventh monitoring device 30, the twenty-sixth monitoring device 30, and the inspection device 80. The wireless communication in the order of the twentieth monitoring device 30 to the twenty-fifth monitoring device 30 means that wireless communication is performed in the order of the twentieth monitoring device 30, the twenty-first monitoring device 30, the twenty-second monitoring device 30, the twenty-third monitoring device 30, the twenty-fourth monitoring device 30, and the twenty-fifth monitoring device 30.

In this case, the twenty-sixth monitoring device 30 corresponds to an inspection transmitting device. The twentieth monitoring device 30 corresponds to an inspection receiving device. The twenty-eighth monitoring device 30 corresponds to an inspection far device. The twenty-eighth monitoring device 30 is arranged at the position farthest from the inspection device 80 among all the monitoring devices 30. The twenty-eighth monitoring device 30 wirelessly communicates with the twenty-fifth monitoring device 30 and the twenty-seventh monitoring device 30, and does not directly communicate with the inspection device 80.

This battery monitoring information includes at least the above-described battery information and the failure diagnosis information. The battery monitoring information may further include manufacturing history information. The manufacturing history information is information indicating manufacturing history of the assembled battery 20, the battery stacks 21, the battery cells 22, and the like. The manufacturing history information is, for example, a manufacturing ID (serial number) and a manufacturing date and time. Further, the inspection device 80 may acquire only the manufacturing history information without acquiring the battery monitoring information. That is, the multiple monitoring devices 30 may transmit battery monitoring information and/or manufacturing history information via wireless communication.

The inspection device 80 inspects a deterioration state and/or abnormality of the battery cell 22, and determines whether the battery cell 22 is reusable based on the inspection result. The inspection device 80 determines whether the battery cell 22 (i.e. assembled battery 20) is suitable for reuse or recycle. The inspection device 80 may be referred to as an inspection tool, a diagnostic device, or an external device, for example.

The battery management system 60 may be provided with at least the monitoring device 30 and the sensor 70 while the battery management system 60 is removed from the vehicle 10 together with the assembled battery 20. That is, the battery management system 60 may be configured to be capable of transmitting battery monitoring information to the inspection device 80 via wireless communication. Therefore, a configuration that does not include the housing 50 and a configuration that does not include the controller 40 may be used for the battery management system 60. Of course, the battery management system 60 may have the same configuration as when mounted on a vehicle. If the controller 40 is not provided, the inspection device 80 may acquire the cell current from the current sensor.

<Inspection Method>

When the assembled battery 20 is not connected to a load (not shown), that is, in a state where the load is not energized by the assembled battery 20, the inspection device 80 may acquire the battery monitoring information held by the monitoring device 30 via wireless communication and inspect (i.e. diagnose) a deterioration state or abnormality of the battery cell 22 to determine whether the battery cell 22 is reusable. That is, the inspection device 80 may inspect (i.e. diagnose) the deterioration state or abnormality of the battery cell 22 and determine whether the battery cell 22 is reusable based on the battery monitoring information held by the monitoring device 30 before making the wireless communication connection with the inspection device 80. The inspection device 80 may determine the reusability based on the battery monitoring information acquired by the monitoring device 30 while the load is not energized. For example, the reusability may be determined based on the cell voltage, that is, an open-circuit voltage.

The inspection device 80 inspects (i.e. determines) the deterioration state of the battery cell 22 based on, for example, the acquired manufacturing history information. The inspection device 80 inspects the deterioration state of the battery cell 22 based on, for example, an elapsed time from the manufacturing date. The inspection device 80 may perform inspection to detect presence or absence of abnormality based on the failure diagnosis information. The inspection device 80 may inspect the deterioration state of the battery cell 22 by estimating the internal resistance or the SOH of the battery cell 22 based on the battery information such as the cell voltage. For example, the internal resistance increases with deterioration of the battery cell 22.

The inspection device 80 may inspect (diagnose) the deterioration state or abnormality of the battery cell 22 and determine whether the battery cell 22 is reusable based also on an inspection result in a state where the load is energized by the assembled battery 20. Specifically, the inspection device 80 may acquire battery monitoring information from the monitoring device 30 and determine the reusability of the battery cell 22 while the assembled battery 20 is connected to the load, that is, the load is energized by the assembled battery 20.

The inspection device 80 inspects the deterioration state of the battery cell 22 by estimating the internal resistance or the SOH of the battery cell 22 based on the acquired battery information, for example. The inspection device 80 inspects abnormality of the battery cell 22 or abnormality of the monitoring device 30 based on, for example, the failure diagnosis information. When the multiple battery management systems 60 are collectively inspected, the assembled batteries 20 (i.e. battery stacks 21) of the multiple battery management systems 60 are connected in series, for example.

Regardless of which of the above inspections is performed, each monitoring device 30 and the inspection device 80 first execute a connection process for wireless communication with a communication partner. The connection process here is the same process as the connection process described in the first embodiment. In the following, as an example, an example in which each monitoring device 30 transmits battery monitoring information will be adopted.

After the connection process is completed, the inspection device 80 first transmits an inspection instruction signal to the twentieth monitoring device 30 which is the inspection receiving device. Each monitoring device 30 transmits battery monitoring information to a transmission partner in the preset communication path at the time of inspection. That is, when each monitoring device 30 directly or indirectly receives the inspection instruction signal transmitted from the inspection device 80, each monitoring device 30 transmits the battery monitoring information in response to the inspection instruction signal. Further, each monitoring device 30 transmits an inspection instruction signal to the transmission partner together with the battery monitoring information.

The twenty-eighth monitoring device 30, which is the inspection far device, receives an inspection instruction signal via the twentieth monitoring device 30. The twenty-eighth monitoring device 30 transmits the battery monitoring information in response to the received inspection instruction signal to the inspection device 80 via the twenty-sixth monitoring device 30.

The monitoring device 30 other than the twentieth monitoring device 30 transmits the received battery monitoring information in addition to the battery monitoring information acquired by itself. Therefore, the twenty-sixth monitoring device 30 transmits the battery monitoring information acquired by all the monitoring devices 30 to the inspection device 80.

This battery monitoring information is held by the monitoring device 30 before the connection process is performed. However, each monitoring device 30 may acquire battery monitoring information after the connection process is completed.

The inspection device 80 inspects (diagnoses) the deterioration state and abnormality of the battery cell 22 and determines the reusability of the battery cell 22 based on the acquired battery monitoring information. A situation where the assembled battery 20 is inspected by the inspection device 80 while the assembled battery 20 and the battery management system 60 are removed from a mobile body is not limited to an inspection of the reusability of the assembled battery 20. For example, the situation may be inspection of the battery pack 11 at the time of manufacture, or an inspection at a repair shop. At the time of these inspections, the monitoring device 30 may insert the battery monitoring information in a packet and transmit it during the connection process for wireless communication between the monitoring device 30 and the communication partner.

Examples of reuse destinations include stationary household power sources, power plants that generate solar power and geothermal power, and storage batteries for disaster countermeasures. In addition, as a reuse destination, a stationary backup power supply for business establishments, stores, factories, etc. can also be mentioned.

As described above, in the inspection system 90, a frequency of failure in transmission of the battery monitoring information to the controller 40 can be reduced as compared with a case where the twenty-eighth monitoring device 30 becomes the inspection transmitting device and transmits the battery monitoring information to the controller 40. The configuration of the present embodiment can be applied to other embodiments.

Other Embodiments

The disclosure in this specification, the drawings, and the like is not limited to the exemplified embodiments. The disclosure encompasses the illustrated embodiments and variations thereof by those skilled in the art. For example, the disclosure is not limited to the parts and/or combinations of elements shown in the embodiments. The disclosure is feasible by various combinations. The disclosure can have additional portions that can be added to the embodiments. The present disclosure encompasses the embodiments where some components and/or elements are omitted. The present disclosure encompasses replacement or combination of components and/or elements between one embodiment and another. The disclosed technical scope is not limited to the description of the embodiments. The several technical scopes disclosed are indicated by the description of the claims, and should be further understood to include meanings equivalent to the description of the claims and all modifications within the scope.

The disclosure in the specification, drawings and the like is not limited by the description of the claims. The disclosures in the specification, the drawings, and the like encompass the technical ideas described in the claims, and further extend to a wider variety of technical ideas than those in the claims. Hence, various technical ideas can be extracted from the disclosure of the specification, the drawings, and the like without being bound by the description of the claims.

When an element or layer is referred to as being "on," "coupled," "connected," or "combined," it may be directly on, coupled, connected, or combined to the other element or layer, or further, intervening elements or layers may be present. In contrast, when an element is referred to as being "directly on," "directly coupled to," "directly connected to," or "directly combined with" another element or layer, there are no intervening elements or layers present. Other terms used to describe the relationship between elements should be interpreted in a similar manner (e.g., "between" and "directly between," "adjacent" and "directly adjacent," and the like). As used herein, the term "and/or" includes any combination and all combinations relating to one or more of the related listed items. For example, the term A and/or B includes only A, only B, or both A and B.

Spatially relative terms such as "inner," "outer," "back," "below," "low," "above," and "high" are utilized herein to facilitate description of one element or feature's relationship to another element(s) or feature(s) as illustrated. Spatial relative terms can be intended to include different orientations of a device in use or operation, in addition to the orientations depicted in the drawings. For example, when a device in a drawing is turned over, elements described as "below" or "directly below" other elements or features are oriented "above" the other elements or features. Therefore, the term "below" can include both above and below. The device may be oriented in the other direction (rotated 90 degrees or in any other direction) and the spatially relative terms used herein are interpreted accordingly.

The device, the system, and the method thereof described in the present disclosure may be implemented by a special purpose computer forming a processor programmed to execute one or more particular functions embodied in computer programs. Alternatively, the apparatuses and methods described in this application may be fully implemented by special purpose hardware logic circuits. Further alternatively, the apparatuses and methods described in this application may be implemented by a special purpose computer created by a combination of a processor executing computer programs coupled with hardware logic circuits. The computer program may be stored in a computer-readable non-transition tangible recording medium as an instruction executed by a computer.

Figure 14:
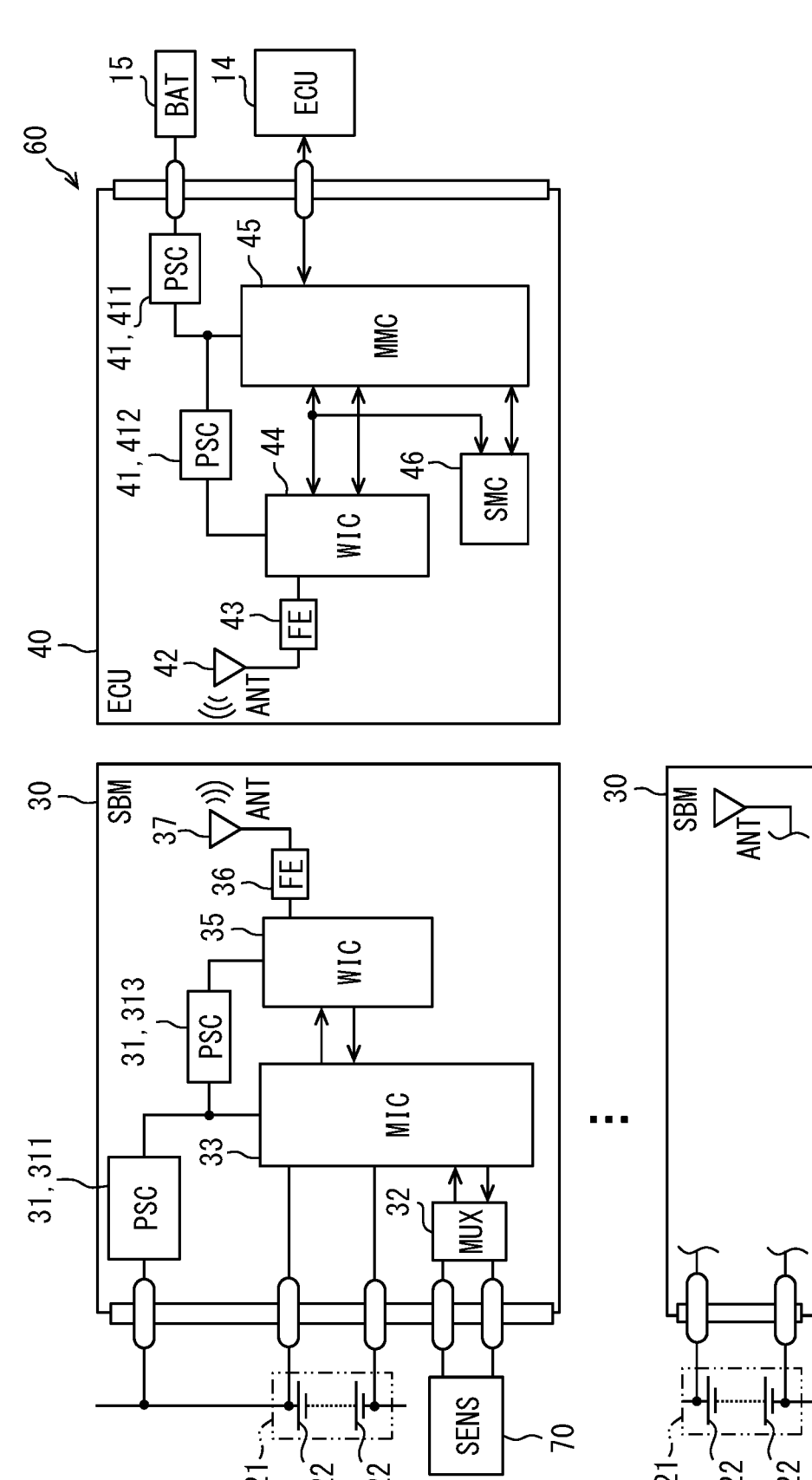
FIG. 14 is a block diagram illustrating a battery management system according to a modification.

For example, an example in which the monitoring device 30 includes the microcontroller 34 has been described, but the present disclosure is not limited thereto. As shown in FIG. 14, a battery management system 60 in which the monitoring device 30 does not include the microcontroller 34 may be adopted. FIG. 14 corresponds to FIG. 4. In this configuration, the wireless IC 35 transmits and receives data to and from the monitoring IC 33. The wireless IC 35 may execute the sensing by the monitoring IC 33 and the schedule control of the self-diagnosis, or the main microcontroller 45 of the controller 40 may execute the sensing and the schedule control.

An example of arranging the monitoring device 30 for each of the respective battery stacks 21 has been shown, but the present disclosure is not limited thereto. For example, one monitoring device 30 may be arranged for multiple battery stacks 21. Multiple monitoring devices 30 may be arranged for one battery stack 21.

While the example in which the battery pack 11 includes one controller 40 has been described, the present invention is not limited thereto. The battery pack 11 may include multiple controllers 40. That is, the battery pack 11 may include one or more monitoring devices 30 and one or more controllers 40. The battery management system 60 may include multiple sets of wireless communication systems constructed between one controller 40 and one or more monitoring devices 30.

An example has been described in which the monitoring device 30 includes one monitoring IC 33, but the present disclosure is not limited thereto. The monitoring device 30 may include multiple monitoring ICs 33. In this case, the wireless IC 35 may be provided for each of the monitoring ICs 33, or one wireless IC 35 may be provided for the multiple monitoring ICs 33.

The arrangement and number of the battery stacks 21 and the battery cells 22 constituting the assembled battery 20 are not limited to the above example. In the battery pack 11, the arrangement of the monitoring device 30 and/or the controller 40 is not limited to the above example.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A battery management system comprising:
   a battery;
   more than three monitoring devices arranged inside a housing together with the battery and configured to monitor the battery and acquire battery monitoring information that includes information indicating a state of the battery; and
   a controller configured to perform wireless communication with two of the more than three monitoring devices and execute a predetermined process that controls the battery to control a voltage of the battery based on the battery monitoring information of each of the more than three monitoring devices, wherein
   the more than three monitoring devices and the controller perform wireless communication via a communication path from the controller through each of the more than three monitoring devices to the controller,
   the controller is configured to:
      transmit a request signal to a receiving device that is one of the more than three monitoring devices, the request signal being a signal requesting for transmission of the battery monitoring information; and
      receive the battery monitoring information of all the more than three monitoring devices from a transmitting device that is one of the more than three monitoring devices different from the receiving device,
   one of the more than three monitoring devices different from the receiving device and the transmitting device is a far device which is farther in distance from the controller than the receiving device and the transmitting device are, and
   the far device is configured to:
      receive the request signal through the receiving device; and
      transmit the battery monitoring information to the controller through the transmitting device in response to the request signal received by the far device,
   wherein the far device does not directly perform wireless communication with the controller.

2. The battery management system according to claim 1, wherein
   the controller and the more than three monitoring devices are nodes in the wireless communication, and
   at least one node of the nodes, which is the controller, the more than three monitoring devices or both the controller and the more than three monitoring devices, is configured to:
      evaluate a communication quality in wireless communication performed by the at least one node of the nodes; and
      switch the communication path according to the communication quality.

3. The battery management system according to claim 2, wherein the at least one node of the nodes is configured to switch the communication path by selecting one communication path from communication paths stored in advance.

4. The battery management system according to claim 2, wherein the at least one node of the nodes is configured to:

accumulate an evaluation result of the communication quality;

determine whether to switch the communication path based on the evaluation result which is accumulated; and switch the communication path when the at least one node of the nodes determines to switch the communication path.

5. The battery management system according to claim 2, wherein the more than three monitoring devices do not need to acquire the battery monitoring information when a predetermined condition is met, and the at least one node of the nodes is configured to switch the communication path only when the more than three monitoring devices do not need to acquire the battery monitoring information.

6. The battery management system according to claim 1, wherein the transmitting device is arranged closest to the controller among all of the more than three monitoring devices.

7. The battery management system according to claim 1, wherein the housing includes:

two side walls that face each other; and an arrangement region in which the more than three monitoring devices are arranged, the arrangement region includes a first region along one of the two side walls and a second region along the other of the two side walls, and at least one of the more than three monitoring devices is arranged in each of the first region and the second region.

8. The battery management system according to claim 7, wherein an obstacle that obstructs the wireless communication is arranged between the first region and the second region.

9. The battery management system according to claim 1, wherein the communication path is set such that the wireless communication is prevented from being obstructed by an obstacle.

10. The battery management system according to claim 1, comprising communication systems that each include the receiving device, the transmitting device, and the far device.

11. The battery management system according to claim 1, to be mounted on a mobile body, wherein the more than three monitoring devices and the battery are removed from the mobile body, the more than three monitoring devices and an inspection device perform wireless communication through an inspection communication path from the inspection device through each of the more than three monitoring devices to the inspection device, one of the more than three monitoring devices is an inspection far device which is farthest in distance from the inspection device among all of the more than three monitoring devices, another of the more than three monitoring devices is an inspection receiving device configured to receive an inspection instruction signal from the inspection device, another of the more than three monitoring devices is an inspection transmitting device configured to transmit information to the inspection device, and the inspection far device is configured to:

receive the inspection instruction signal through the inspection receiving device; and transmit the battery monitoring information and/or manufacturing history information of the battery to the inspection device through the inspection transmitting device in response to the inspection instruction signal received by the inspection far device, wherein the inspection far device does not directly perform wireless communication with the controller.

12. The battery management system according to claim 1, wherein the more than three monitoring devices further include a plurality of far devices including the far device, and all of the more than three monitoring devices, except for the transmitting device and the receiving device, are the plurality of far devices.

13. The battery management system according to claim 1, wherein each of the more than three monitoring devices is configured to, in response to receiving the request signal, add the battery monitoring information acquired from itself to the request signal and transmit the request signal to a next node in the communication path.

14. The battery management system according to claim 1, wherein the communication path is a chain communication from the controller sequentially through each of the more than three monitoring devices in order and then to the controller.

15. The battery management system according to claim 1, wherein the controller is configured to perform wireless communication directly with only two of the more than three monitoring devices.

16. The battery management system according to claim 1, wherein a sequence of the more than three monitoring devices in the communication path is predetermined.

17. A method for managing a battery, the battery being arranged inside a housing together with more than three monitoring devices that are configured to monitor the battery and acquire battery monitoring information that includes information indicating a state of the battery, a controller being configured to perform wireless communication with two of the more than three monitoring devices and execute a predetermined process that controls the battery to control a voltage of the battery based on the battery monitoring information of each of the more than three monitoring devices, the more than three monitoring devices and the controller performing wireless communication via a communication path from the controller through each of the more than three monitoring devices to the controller, the method comprising:

transmitting a request signal from the controller to a receiving device that is one of the more than three monitoring devices, the request signal being a signal requesting for transmission of the battery monitoring information;

transmitting the battery monitoring information of all the more than three monitoring devices to the controller from a transmitting device that is one of the more than three monitoring devices different from the receiving device;

transmitting the request signal from the receiving device to a far device that is one of the more than three monitoring devices different from the receiving device and the transmitting device and is farther in distance from the controller than the receiving device and the transmitting device are; and transmitting the battery monitoring information from the far device to the transmitting device in response to the request signal which is received by the far device, wherein the far device does not directly perform wireless communication with the controller.

\* \* \* \* \*